(12) United States Patent
Parker et al.

(10) Patent No.: US 9,111,715 B2
(45) Date of Patent: Aug. 18, 2015

(54) CHARGED PARTICLE ENERGY FILTER

(75) Inventors: N. William Parker, Hillsboro, OR (US); Wesley Hughes, Beaverton, OR (US)

(73) Assignee: FEI COMPANY, Hillsboro, OR (US)

( * ) Notice: Subject to any disclaimer, the term of this patent is extended or adjusted under 35 U.S.C. 154(b) by 30 days.

(21) Appl. No.: 13/601,818

(22) Filed: Aug. 31, 2012

(65) Prior Publication Data
US 2013/0112890 A1    May 9, 2013

Related U.S. Application Data

(60) Provisional application No. 61/557,375, filed on Nov. 8, 2011.

(51) Int. Cl.
*H01J 37/05* (2006.01)
*H01J 37/305* (2006.01)

(52) U.S. Cl.
CPC ............. *H01J 37/05* (2013.01); *H01J 37/3056* (2013.01); *H01J 2237/043* (2013.01); *H01J 2237/057* (2013.01); *H01J 2237/1534* (2013.01)

(58) Field of Classification Search
CPC ........................... H01J 37/05; H01J 2237/057
USPC ...................................... 250/396 R
See application file for complete search history.

(56) References Cited

U.S. PATENT DOCUMENTS

| | | | |
|---|---|---|---|
| 4,623,794 A * | 11/1986 | Rose et al. ................. | 250/396 R |
| 5,126,565 A | 6/1992 | Rose | |
| 5,448,063 A | 9/1995 | de Jong et al. | |
| 5,798,524 A | 8/1998 | Kundmann et al. | |
| 5,838,004 A | 11/1998 | Tiemeijer et al. | |
| 6,218,664 B1 | 4/2001 | Krans et al. | |
| 6,489,621 B1 | 12/2002 | Frosien | |
| 6,501,076 B1 | 12/2002 | Kelly et al. | |
| 6,822,246 B2 * | 11/2004 | Bertsche ................. | 250/492.21 |
| 7,034,315 B2 | 4/2006 | Henstra et al. | |
| 7,326,925 B2 * | 2/2008 | Verentchikov et al. ....... | 250/287 |
| 7,755,067 B2 * | 7/2010 | Tsukihara et al. ....... | 250/492.21 |
| 7,999,225 B2 | 8/2011 | Henstra | |
| 8,294,093 B1 | 10/2012 | Tuggle et al. | |
| 8,461,525 B2 | 6/2013 | Henstra | |
| 2002/0033455 A1 * | 3/2002 | Rose ......................... | 250/396 R |
| 2002/0109089 A1 | 8/2002 | Krans et al. | |
| 2012/0112090 A1 | 5/2012 | Henstra | |

OTHER PUBLICATIONS

Gubbens, Alexander, et al., 'The GIF quantum, a next generation post-column imaging energy filter,' Ultramicroscopy, Jul. 2010, pp. 962-970, vol. 110, No. 8.

(Continued)

*Primary Examiner* — Jack Berman
*Assistant Examiner* — Eliza Osenbaugh-Stewar
(74) *Attorney, Agent, or Firm* — Scheinberg & Associates, PC; Michael O. Scheinberg; John E. Hillert

(57) ABSTRACT

A multi-element electrostatic chicane energy filter, with the addition of electrostatic quadrupole and hexapole excitations to the dipole elements. A charged particle energy filter according to the present invention with a combination of dipole, quadrupole, and hexapole elements capable of producing a line focus at an aperture reduces space-charge effects and aperture damage. A preferred embodiment allows the filter to act as a conjugate blanking system. The energy filter is capable of narrowing the energy spread to result in a smaller beam.

28 Claims, 20 Drawing Sheets

(56) References Cited

OTHER PUBLICATIONS

Uhlemann, S., et al., "Experimental Set-Up of a Fully Electrostatic Monochromator for a 200 kV TEM," The Proceedings of the 15th International Congress on Electron Microscopy, Sep. 1-6, 2002, 2 pgs.

Benner, Gerd, et al., "Design and First Results of SESAM," Microscopy and Microanalysis, 2003, pp. 66-67, vol. 9, Suppl. 03.

Plies, Erich, et al., "Proposal of a Novel Highly Symmetric Wien Filter Monochromator," Microscopy and Microanalysis, 2003, pp. 28-29, vol. 9, Suppl. 03.

\* cited by examiner

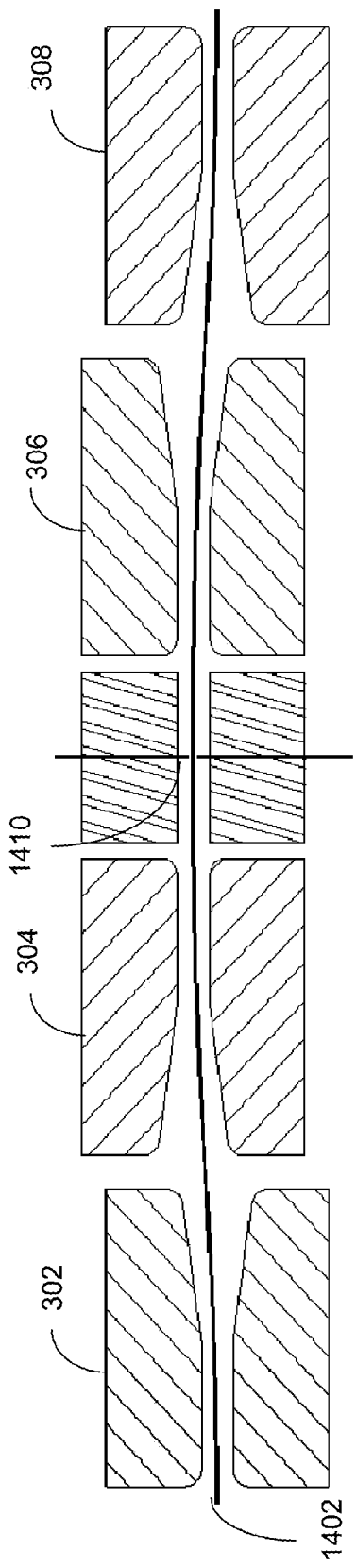
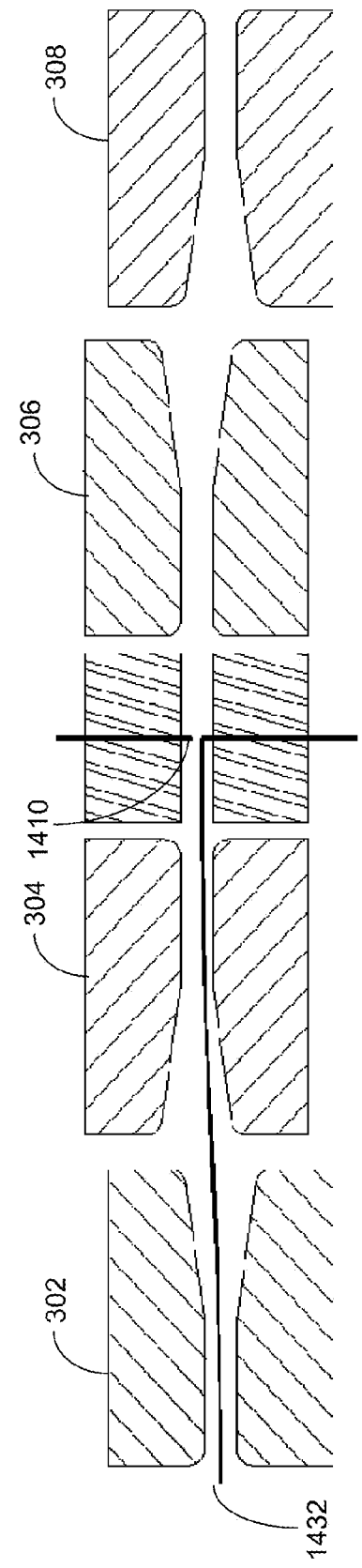
FIG. 14A
FIG. 14B

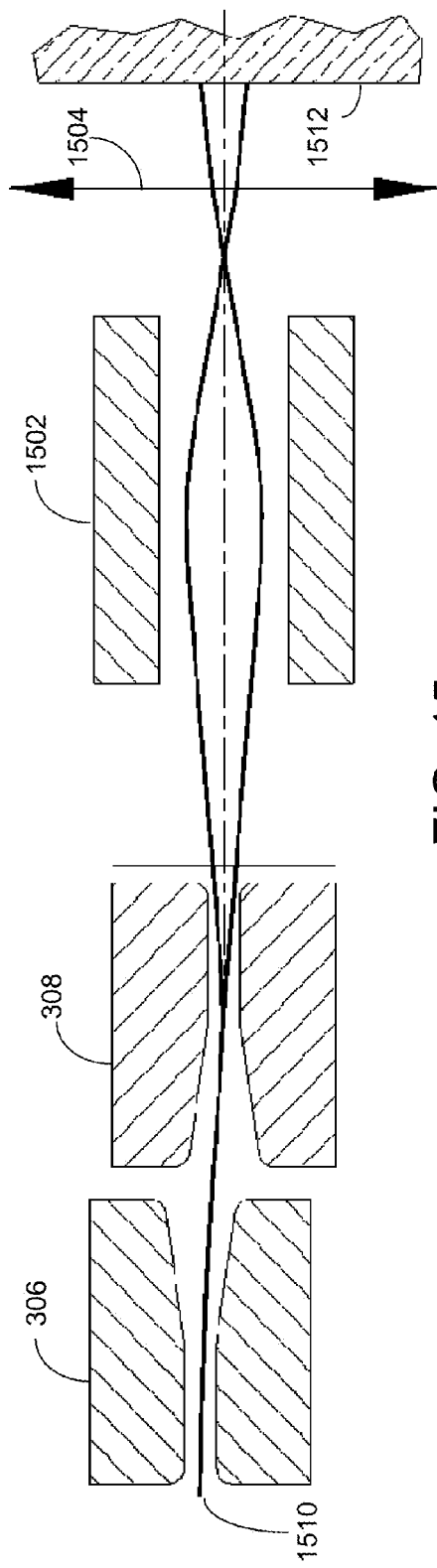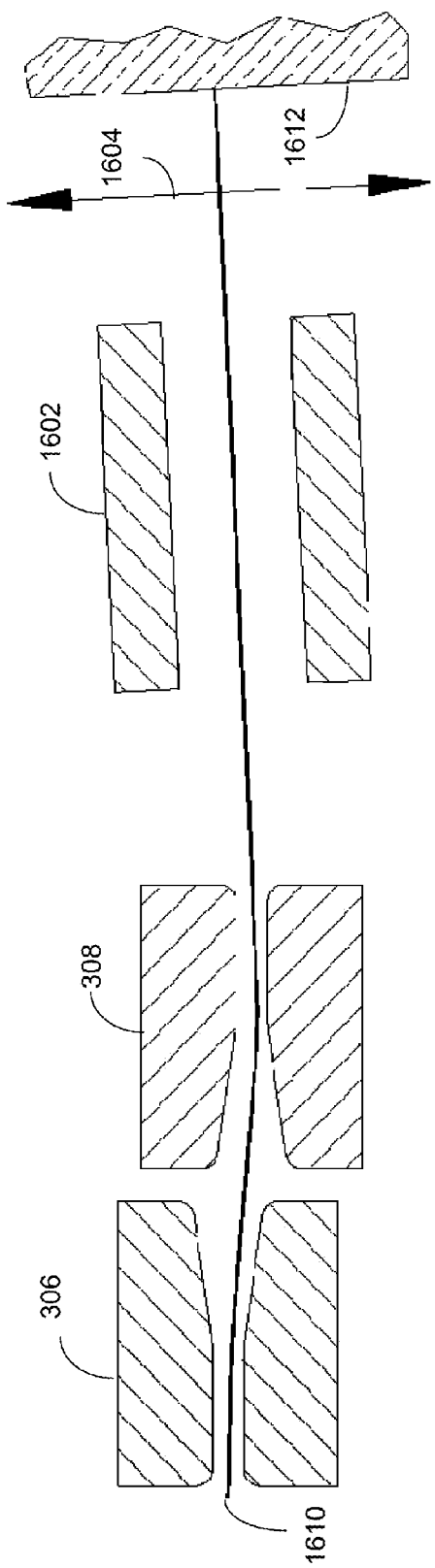
FIG. 15
FIG. 16

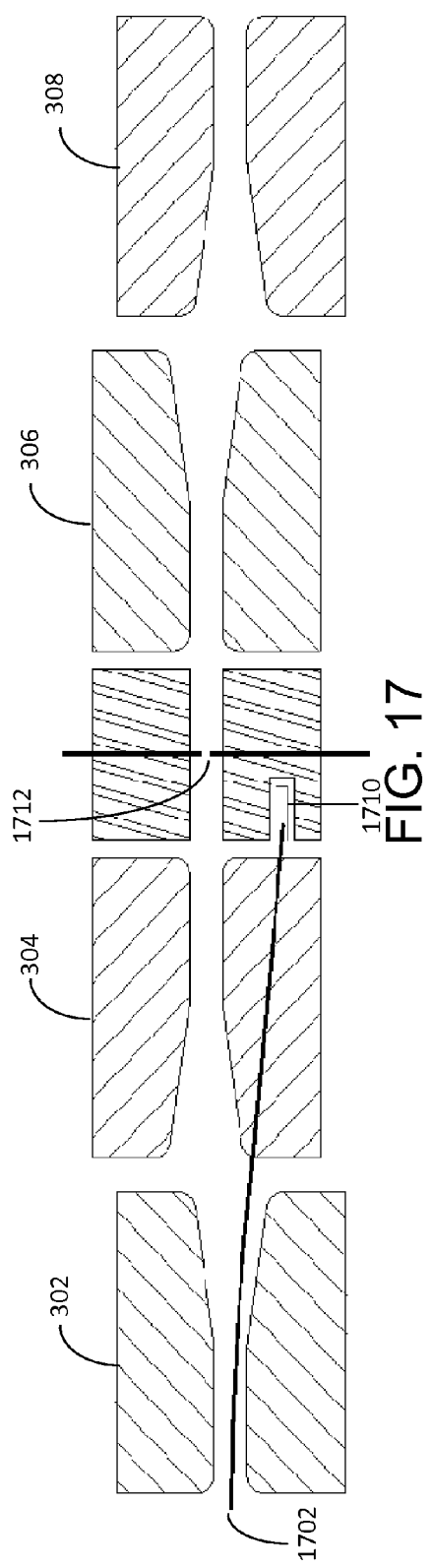
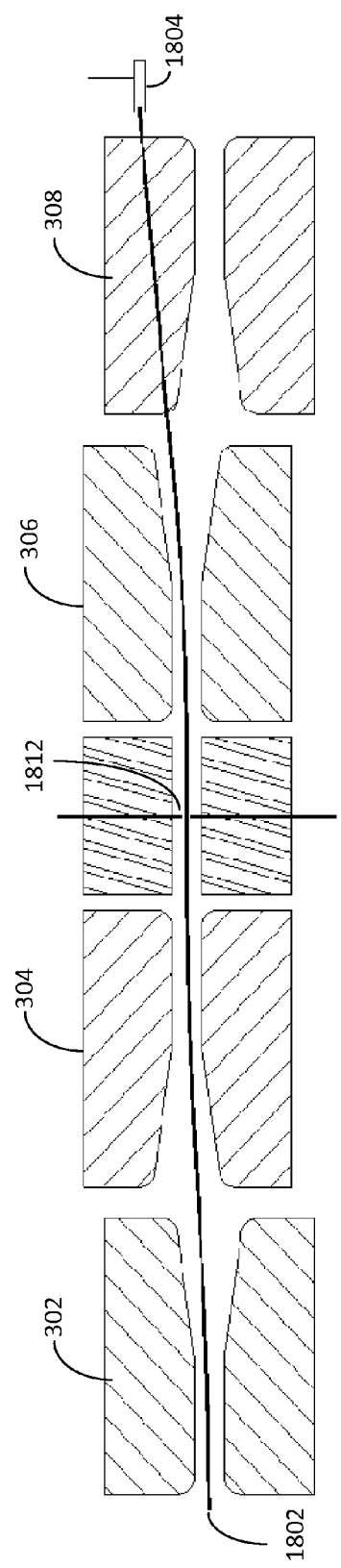

CHARGED PARTICLE ENERGY FILTER

This Application claims priority from U.S. Provisional Application 61/557,375, filed Nov. 8, 2011, which is hereby incorporated by reference.

TECHNICAL FIELD OF THE INVENTION

The present invention relates to an improved charged particle beam device and more particularly to an energy filter for improving beam quality and milling quality in such a device.

BACKGROUND OF THE INVENTION

In focused ion beam (FIB) systems, ions are extracted from a source, formed into a beam, focused, and scanned across a substrate to form an image of a feature, to mill a feature or to deposit material from a gas ambient. As features become increasingly small, the FIB system must be optimized to provide a higher quality beam, that is, a smaller, more focused beam spot in which the distribution of current should be as compact as possible.

Several factors reduce the quality of the current distribution of the FIB. For ion columns using a liquid metal ion source (LMIS), a primary cause of reduced beam quality at low to moderate beam current is chromatic aberration. Gallium ions emitted from a liquid metal ion source have an energy distribution which is a combination of the intrinsic and particle interactions; the latter component is commonly referred to the as the Boersch affect. The former is very complicated as there are several different mechanisms to form the ions. Chromatic aberration is the result of particles of different energies being focused at different locations by the lenses in the ion column. The chromatic aberration causes the beam current distribution to vary with the energy spread ($\Delta E$) of the ions. If the energies of the ions in an ion beam are plotted on a histogram showing the frequency of occurrence of ions at each energy value, the graph will have a peak at a "nominal" energy value, decrease rapidly for energies above and below the peak, and then taper off more slowly. The regions where the graph tapers off are known as the beam "tail." The energy spread, $\Delta E$, is typically measured as the "full width, half maximum," that is, the energy between points at half the maximum peak value on either side of the peak. In a typical gallium liquid metal ion source, the energy spread in the beam having a current of 1 pA to several hundred nA is typically about 5 eV at an emission current of 1.5 to 2.5 µA from the source.

FIGS. 1A-1C are photomicrographs that show the effects of the beam energy tail on ion beam milling of photoresist. The features shown in FIGS. 1A-1C were milled using a gold-silicon ion source, with a beam current of 0.2 nA. In FIG. 1A, the beam was applied for two seconds to provide a dose of $4 \times 10^{14}$ ions per $cm^2$. The beam was moved in a square pattern to mill a central square 100 nm on a side. The ions in the energy tail, having energies away from the peak were deflected differently in the ion column and fell outside the square, milling the photoresist lightly out to circle 102.

In FIG. 1B, the beam was applied for 10 seconds for a total ion dose of $2 \times 10^{15}$ ions per $cm^2$. The relative number of ions having a particular energy value decreases as the particular energy value is farther from the nominal beam value. That is, the number of ions gets smaller as the energy value gets farther from the nominal value. As the total number of ions is increased, however, ions having energies farther from the nominal value will also increase in number. The longer the milling operation, the more the effects of ions further out in the energy tail will be seen. The circle 102 is wider in FIG. 1B than in FIG. 1A because ions further in the tail from the nominal value are having an increased effect because of their increased number. In FIG. 1C, the beam was applied for 100 seconds for a total ion dose of $2 \times 10^{16}$ ions per $cm^2$, and the circle 102 is even wider as the number of ions further away from the nominal energy value increases and the effects are more visible.

For e-beam imaging systems, the imaging acuity is a function of the chromatic aberrations in the focusing column, combined with contributions from the source size, diffraction, and spherical aberration. Chromatic aberration is proportional to the energy spread of the electrons, thus if an energy filter were used in an e-beam column, smaller beams could be achieved, thereby improving imaging acuity.

One type of prior art energy filter is a "chicane" dual-bend energy filter in which the charged particle beam is jogged off-axis and then back on-axis, usually by four dipole deflectors in series down the column, typically located between the upper column and the final lens. Between the second and third deflectors of the chicane, there is usually positioned either a knife-edge or a round aperture to block the passage of ions either below a nominal energy for a high pass filter or within a nominal energy range for a band pass filter, respectively. In either case, since the beam is focused to a crossover at the aperture plane by a lens above the energy filter, increased space-charge effects will inevitably occur. These effects increase both the energy spread of the beam, known as the "Boersch Effect" and the transverse spatial broadening of the beam, known as the "Loeffler Effect."

FIG. 2 is an isometric view of a prior art chicane energy filter 200 comprising four dipole elements 202, 204, 206, and 208. For proper energy filtering, a lens (not shown here) located above the column focuses the charged particle beam into a round spot (not shown) in the plane of the aperture within aperture assembly 210. For high- or low-pass energy filtering, the aperture may be a knife-edge or slit. For band-pass energy filtering, the aperture may be either a slit or a circular hole. In either of these cases in the prior art, the beam current density will typically be very high at the aperture since the beam is focused along both the dispersion axis (vertical in this view) and perpendicular to the dispersion axis (upper right to lower left in this view). Thus, for both ion and electron beams, strong space-charge interactions may occur at and near the aperture. For ion beams, this high beam current density will also produce undesirable sputtering of the aperture for all those ions outside the pass-band of the energy filter. The four elements 202, 204, 206, and 208 are excited as dipoles to provide the required beam offset at the aperture. In this illustration, 202, 204, 206, and 208 have been implemented as octupoles, each with eight independently-excitable electrodes, which is a common practice known in the prior art to improve the electrostatic field uniformity over a wider physical aperture, thereby reducing optical aberrations. In the prior art, elements 202, 204, 206, and 208 are alternatively known to be implemented as pairs of parallel flat electrostatic electrodes or as quadrupoles.

In prior art chicane energy filters, the beam is brought to a focus at the aperture plane and those ions having energies which are not desired in the final beam are caused to impact the aperture, thereby blocking them from passing into the final lens. Due to the high beam current densities and energies (usually the final beam energy which can be up to 30-40 keV) of these blocked beams, sputtering of the aperture may be significant, sometimes resulting in sputtering holes completely through the aperture. Once this has happened, the charged particle beam system must be opened for replacement of the damaged aperture.

In certain FIB columns, the beam blanker is a single deflecting element, which means that it is not possible for the beam to be "conjugately blanked," which would allow the beam to go on and off without any beam motion at the sample. When using a single deflecting element as a beam blanker, as the beam is deflected off-axis in order to prevent it from reaching the sample, the beam is simultaneously moved at the sample, causing the beam to expose and thereby mill areas which are not intended to be processed by the beam.

Additionally, in some current FIB columns, some particles leave the source as neutrals, or are neutralized within the column before the final lens. Since these particles are uncharged, they cannot be focused onto the target and result in a wide neutral background that may cause unwanted milling or a loss in image contrast. Therefore, it would be desirable to be able to remove this background from the beam before it enters the final lens.

The prior art chicane filters employ a round focus at the energy-filtering aperture and are negatively impacted by both space charge effects and aperture damage. Thus, there is also a need for an energy filter capable of reducing these adverse effects on imaging and milling acuity, as well as aperture lifetime.

SUMMARY OF THE INVENTION

An object of the invention is to solve these problems of the prior art and to provide a system and method to enhance the beam quality for milling and/or imaging of a sample. According to preferred embodiments of the present invention, the addition of electrostatic quadrupole and hexapole excitations to the dipole elements in a chicane energy filters form the beam into a line focus at an aperture positioned between the second and third elements of the chicane. Applicants have found that this addition further improves the energy resolution by making the line focus both sharper and straighter at the aperture plane. In some embodiments, a chicane energy filter can function as a conjugate blanker.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIGS. 14A and 14B illustrate a chicane energy filter according to a preferred embodiment of the present invention operating as a conjugate beam blanker;

FIG. 15 illustrates a chicane energy filter according to a preferred embodiment of the present invention operating as part of a double-deflection beam scanning system;

FIG. 16 illustrates a chicane energy filter according to a preferred embodiment of the present invention operating as a double-deflection aligner;

FIG. 17 is a chicane energy filter according to a preferred embodiment of the present invention operating to measure the beam current prior to energy filtering;

FIG. 18 is a chicane Energy Filter according to a preferred embodiment of the present invention operating to measure the beam current after energy filtering.

DETAILED DESCRIPTION OF PREFERRED EMBODIMENTS

Figure 1A:
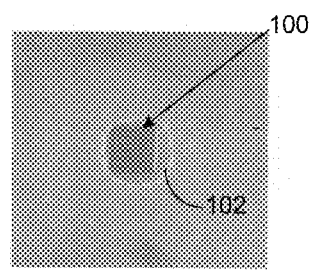
FIGS. 1A-1C are photomicrographs showing the effects of the beam energy tail.
Figure 1B:
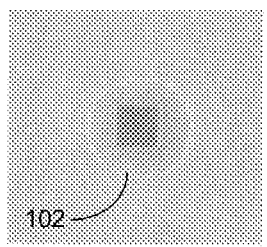
Figure 1C:
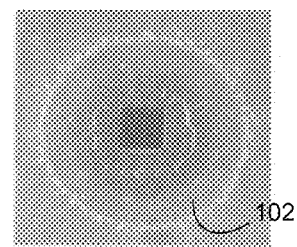

Some preferred embodiments of the present invention comprise a four-element electrostatic chicane energy filter, with the novel addition of electrostatic quadrupole and hexapole excitations to the dipole elements. Other preferred embodiments comprise five elements to afford improved flexibility with respect to magnification and beam currents. The quadrupole elements preferably form the beam into a line focus at an aperture positioned between the second and third elements of the chicane. This line focus is preferably about twice as long as the diameters of the incoming and outgoing beams at the entrance and exit, respectively, to the energy filter. The line focus substantially reduces beam current density, reduces aperture sputtering or contamination by orders of magnitude (≤1/10 of the sputtering or contamination of the prior art), and reduces space charge effects by orders of magnitude (≤1/10 of the prior art). Each of the four elements of the chicane may be implemented using octupoles, each having eight separately excited electrodes. Applicants have discovered through extensive charged particle modeling that the addition of a hexapole excitation to the dipole and quadrupole excitations further improves the energy resolution by making the line focus both sharper and straighter at the aperture plane. Thus, with a narrow slit aperture, typically less than 500 nm, energy filtering down to a few eV of energy was possible in principle. With wider apertures, typically less than 1 µm or less than 3 µm, the spatial "tails" of the ion beam may be removed with no impact on the central beam spot.

Preferred embodiments of the present invention improve imaging and milling acuity by narrowing the energy distribution of the beam exiting the energy filter and passing into the final lens to be focused onto the sample being imaged or milled. This substantially eliminates the spatial tails of the beam, which results in a smaller, higher quality beam. Increased space-charge effects, which in turn increase the energy spread and the spatial broadening of the beam, are substantially reduced as a line focus is incorporated instead of the round foci of the prior art chicane filters. The current density in the line focus is several orders of magnitude lower than for round foci having diameters similar to the width of the line focus of the present invention. This advantage applies to both ion beam and electron beam systems.

Sputtering and subsequent replacement of the aperture is also substantially reduced since the lowered beam current density proportionately reduces the sputtering rate of the aperture material. This advantage is most apparent in ion beam systems, since electron beams do not sputter away material. However, e-beam systems do have a problem with aperture contamination. Thus, the use of a low current density line focus at the aperture plane may result in improved performance for an energy filter in an e-beam system. Effectively, both aperture sputtering (for ions) and aperture contamination (for electrons and, possibly, ions) may both be considered "aperture damage" in the discussion herein.

Processing unintended areas due to the lack of a conjugate blanking mechanism in current FIB columns is also resolved by using four of the elements of the energy filter as an "extended" beam blanker with appropriate time delays between elements to account for the time-of-flight through the energy filter. Electronically, this may be implemented using multiplying digital-to-analog convertors (DACs) to drive the electrode voltages and then modulating the reference voltage to change the deflection strengths of all four optical elements with inter-element time delays. This allows the beam to exit the energy filter on-axis up to the point at which the beam cuts off on the slit aperture. The deflection at the aperture while the beam is blanked may be made large enough to avoid sputter erosion of the aperture slit.

The energy filters according to preferred embodiments of the present invention may naturally remove the neutral particles, which are undeflected by the first element and thus travel straight ahead to collide with the aperture mounting assembly.

An energy filter according to some preferred embodiments of the present invention comprises a four-element chicane in which the beam is deflected off-axis, typically 2 to 4 mm, and then an aperture using a slit, after which the beam is moved back onto an exit axis that is collinear to the entrance axis. An energy filter according to preferred embodiments of the present invention preferably has the following specifications:

1) All-electrostatic octupole elements, with dipole, quadrupole, and (optionally) hexapole excitations.
2) Minimize effect on overall first-order optics of the column (outside the energy filter).
3) Effectively no crossover from the perspective of the column first-order optics and with respect to space-charge beam broadening.
4) Collinear optics: entrance axis is the same as the exit axis.
5) Line focus at the energy-filtering aperture.
6) Capability for conjugate blanking of the beam.
7) Capability for double-deflection beam alignment into the final lens (L2).
8) The final element of the Energy Filter may double as the upper deflector for beam scanning.
9) Neutral particles may be removed from the beam by blocking them at the aperture mounting assembly within the Energy Filter.

Not all embodiments will provide all the benefits. Various embodiments of an energy filter designed and operated according to a preferred embodiment of the present invention are illustrated in FIG. 3 through FIG. 16.

Figure 2:
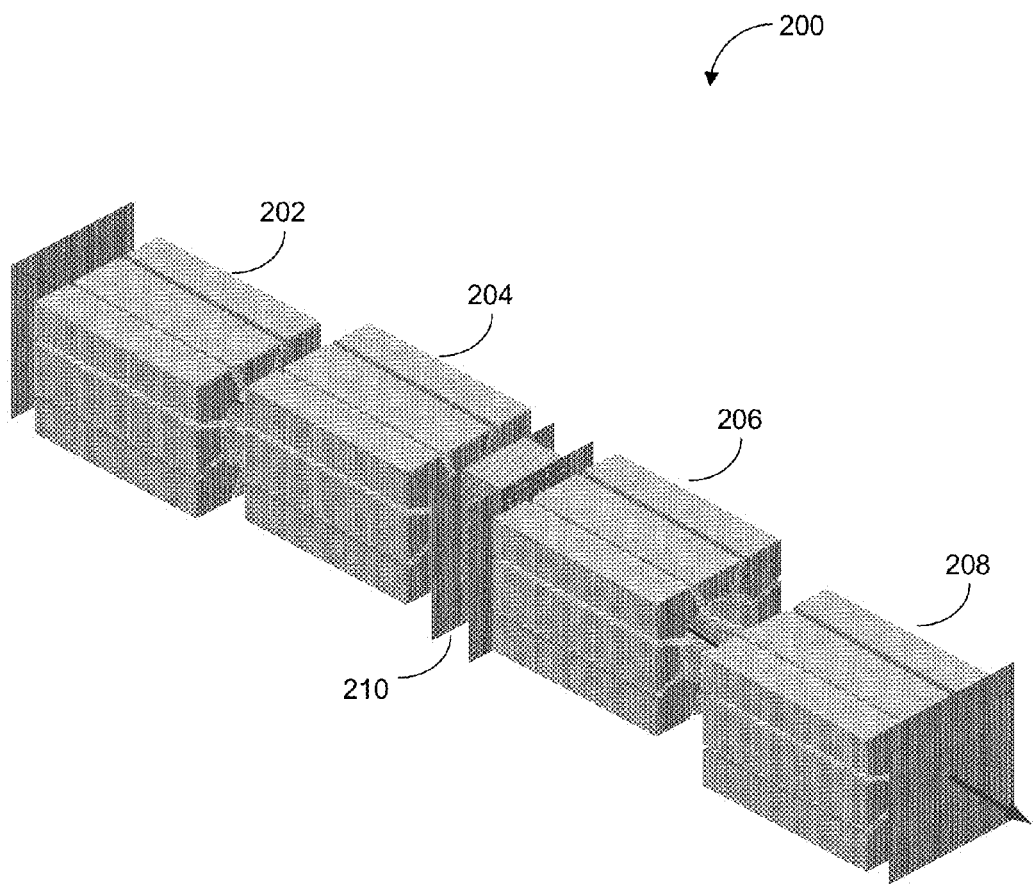
FIG. 2 is an isometric view of a prior art chicane energy filter comprising four dipole elements.
Figure 3:
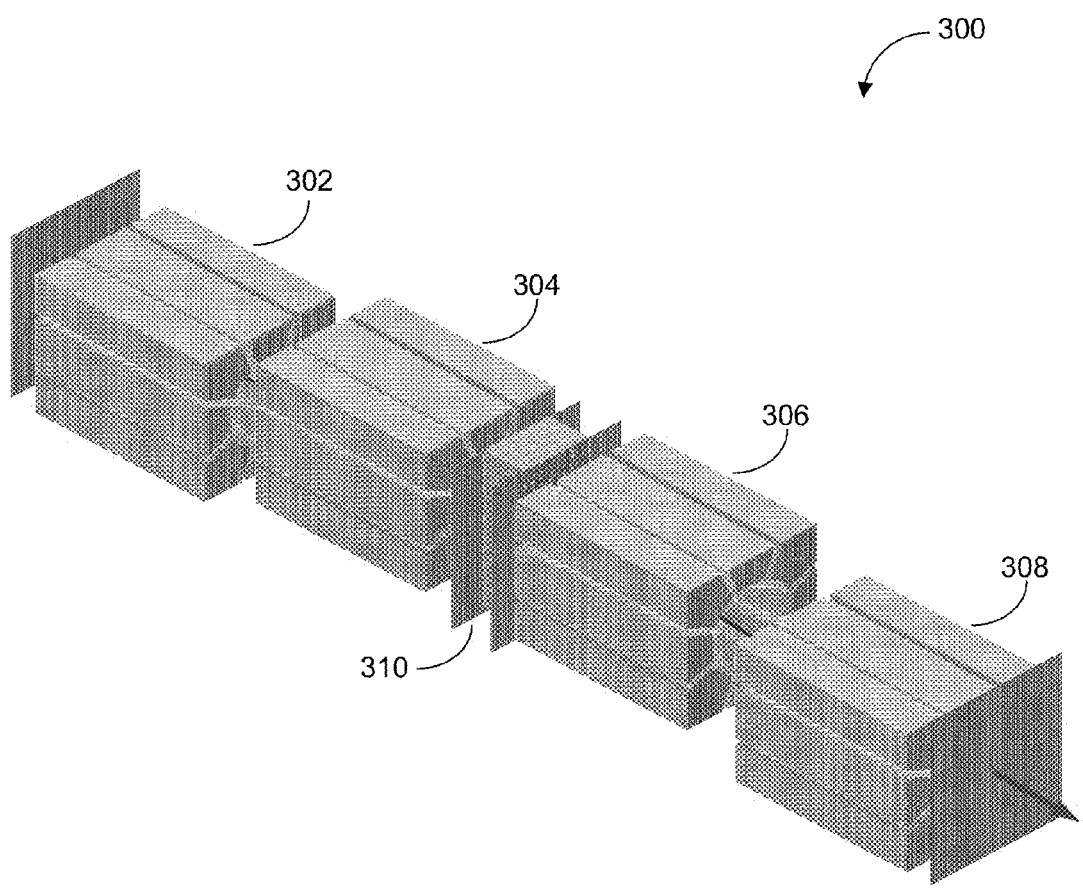
FIG. 3 is an isometric view of an energy filter according to a preferred embodiment of the present invention comprising four octupole elements with dipole, quadrupole, and hexapole excitations.

FIG. 3 is an isometric view of an energy filter 300 according to a preferred embodiment of the present invention, comprising four octupole elements 302, 304, 306, and 308 with dipole, quadrupole, and (optionally) hexapole excitations. Aperture assembly 310 contains an aperture that could be a knife-edge for either high- or low-pass energy filtering, or a slit for bandpass energy filtering. A circular aperture cannot be used since the beam is formed into a line focus at the plane of the aperture. Unlike the prior art energy filter in FIG. 2, an energy filter designed according to a preferred embodiment of the present invention does not require pre-focusing of the beam into the plane of the aperture since all first-order focusing is performed by the quadrupole excitations applied to 302, 304, 306, and 308. The energy dispersion axis is vertical in FIG. 3, and elements 304 and 306 are offset vertically upwards by an amount equal to the beam offset induced by the combined effects of the dipole excitations of 302 and 304 (and cancelled by the dipole excitations of 306 and 308). Extensive charged particle optics modeling demonstrated the benefits of added hexapole excitations to elements 302, 304, 306, and 308 for some situations, particularly those involving larger beam diameters entering the energy filter: these excitations reduce the aberrations of the dipole and quadrupole components of elements 302, 304, 306, and 308 which stem from the fringing fields at the entrances and exits of these elements.

Figure 4:
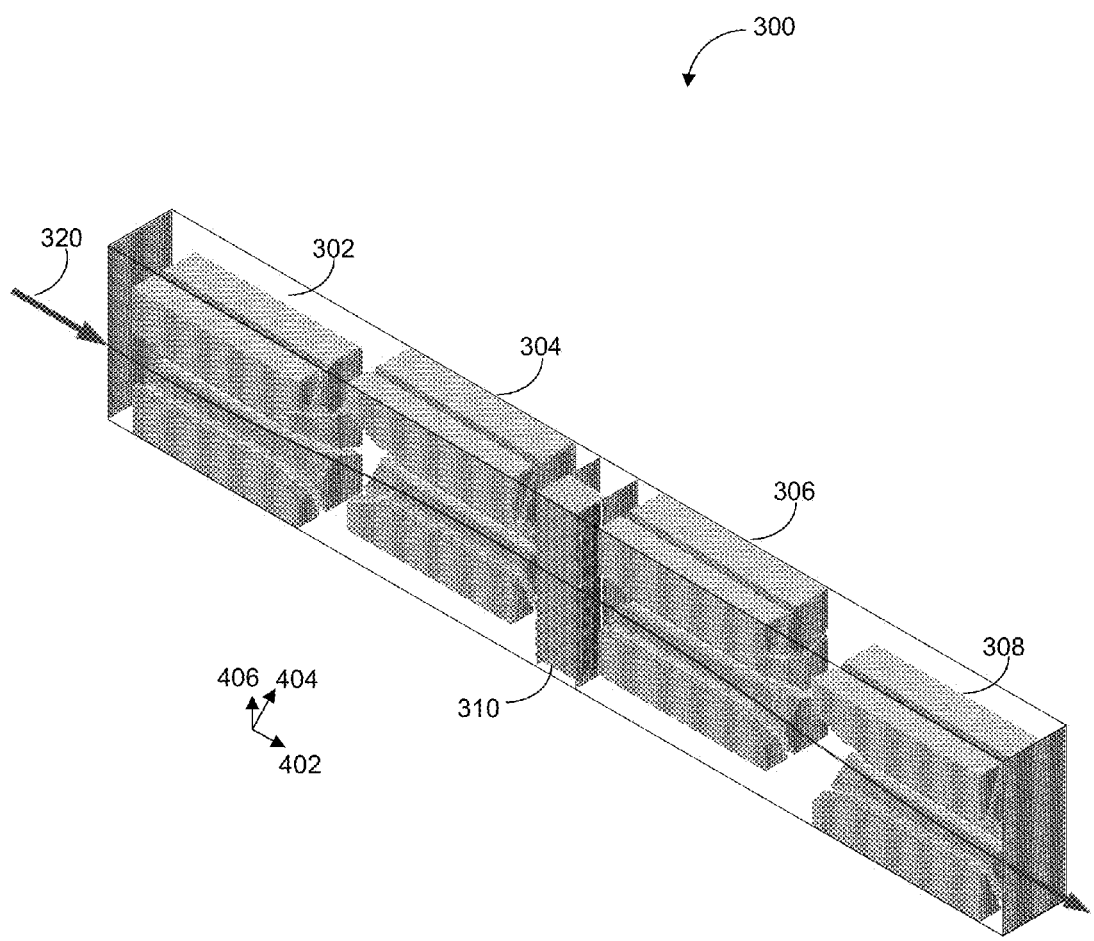
FIG. 4 is a cutaway isometric view of the energy filter of FIG. 3 illustrating the charged particle beam path through the filter.

FIG. 4 is a cutaway isometric view corresponding to FIG. 3 of an energy filter 300 according to a preferred embodiment of the present invention illustrating the charged particle beam path through the filter. Unfiltered beam 320 enters the filter from the upper left along axis 402. The dipole excitation on element 302 then deflects the beam upwards along axis 406, while the quadrupole excitation on element 302 focuses the beam along vertical axis 406 while spreading the beam into a line focus along the horizontal axis 404 (upper right to lower left in this isometric view). The dipole excitation of element 304 then deflects the beam back to the same direction as entering element 302, but offset by typically 2 to 4 mm from the original beam axis. The quadrupole excitation on 304 slightly defocuses the beam along the vertical axis 406, while strongly focusing the beam along the horizontal axis 404. The net result of these deflections and focusing is that the beam reaching the aperture is moving approximately parallel to the original axis, but offset, and has been formed into a wide horizontal line focus (see FIG. 7).

That portion of the initial beam having energies outside the desired passband will strike the slit aperture (either above or below the slit opening), thereby being blocked from passing through the energy filter and on to the target being imaged or processed by the beam. That portion of the initial beam having the desired beam energies will pass by the knife-edge or through the slit, and thus on to the final lens to be focused onto the target. The excitations of elements 308 and 306 essentially minor those of elements 302 and 304, respectively. In preferred embodiments there will be no significant first-order optical effects due to the energy filter and also minimal higher-order aberrations.

Figure 5:
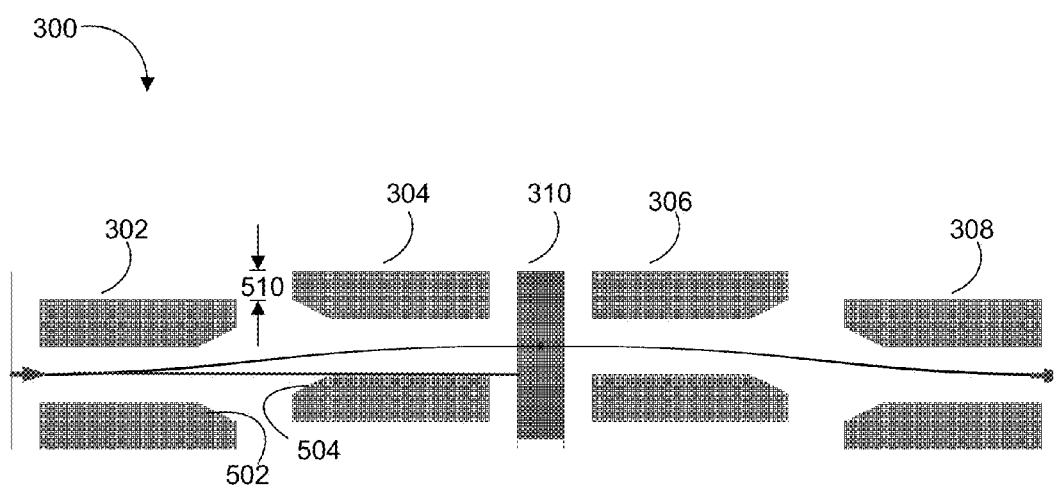
FIG. 5 is a side cross-sectional view of the energy filter of FIG. 3.
Figure 20:
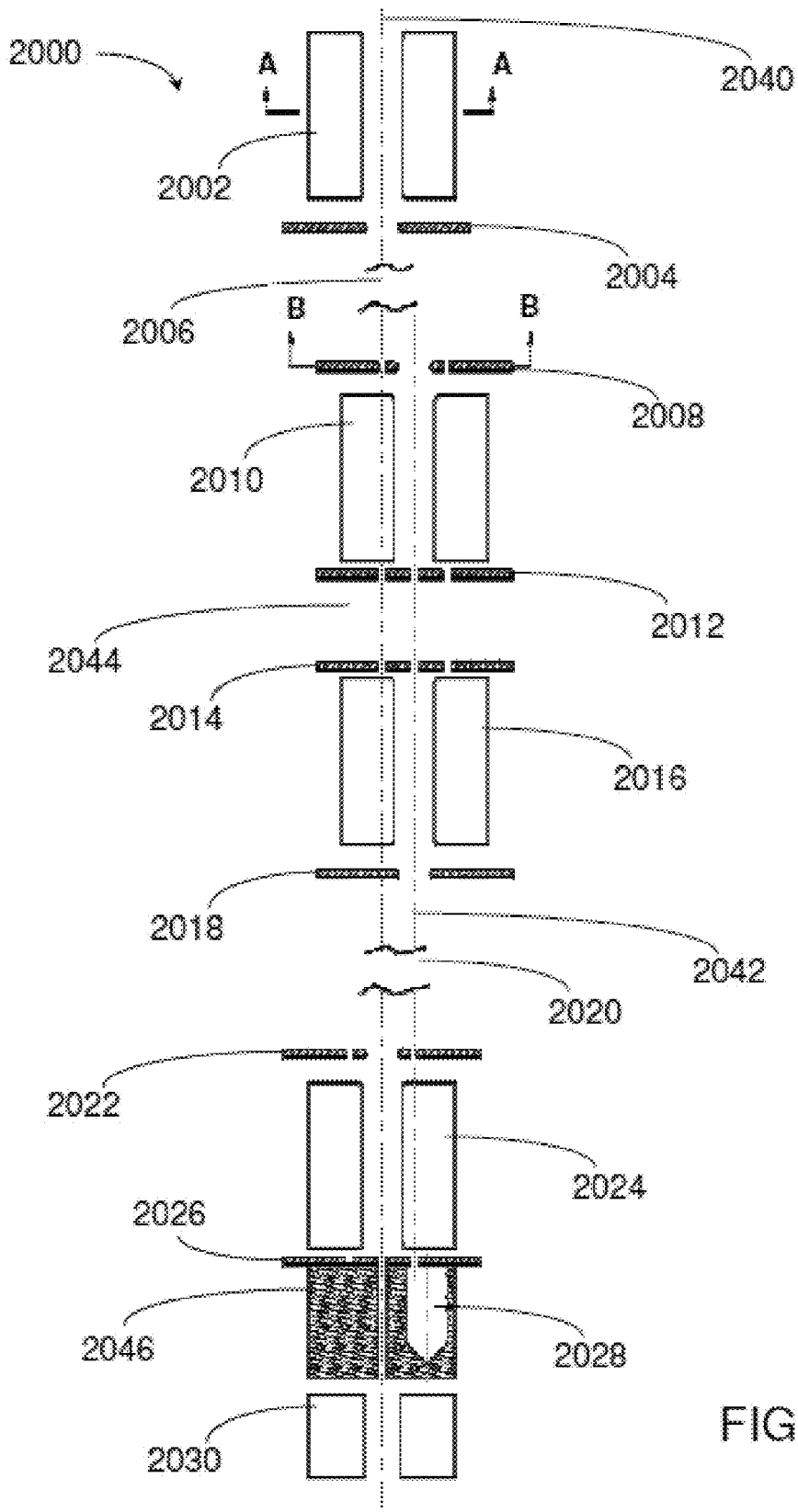
FIG. 20 shows aside cross-sectional view of an embodiment of the invention comprising five octupoles.

FIG. 5 is a side cross-sectional view of energy filter 300 according to a preferred embodiment of the present invention described in FIGS. 3 and 4. The conical exits 502 of elements 302 and 306 as well as the conical entrances 504 of elements 304 and 308 can be seen more clearly in FIG. 5. These conical features may optionally be incorporated in some embodiments to reduce the aberrations induced by the energy filter 300. Without these conical entrances and exits, beam 520 passing between 302 and 304 and a beam passing between 306 and 308, would both pass very close to individual electrodes, and would thus be exposed to the fringing fields of octupole elements 302, 304, 306, and 308. These conical features may be beneficial in enhancing the energy filter optical performance by moving the electrodes farther away from the beam as can be seen more clearly in FIGS. 14A and B. An alternative method using termination plates to reduce the effects of fringing fields at the entrances and exits of the octupoles is illustrated in FIG. 20 for another embodiment of the invention. The sideways offset 510 of elements 304 and 306 may also be seen more clearly in FIG. 5. This offset enables the beam to exit element 304 on-axis, and also enter element 306 on-axis, in both cases further reducing aberrations. In preferred embodiments, typical dipole voltages may range from −600 to +600 V, typical quadrupole voltages from −250 to +250 V, and typical hexapole voltages from −2.5 to +2.5 V. The magnitudes of the voltages on elements 302 and 308 are generally somewhat larger than on elements 304 and 306 because the beam is larger perpendicular to the dispersion axis within elements 304 and 306. Thus the quadrupoles are more effective at focusing the beam since the deflection force of quadrupoles is proportional to the beam displacement off the centerline of an optical element. Elements 302, 304, 306, and 308 are preferably all electrostatic to avoid mass-dispersive effects with differing ion masses. For energy filters in electron beam columns or ion columns employing single-element mono-isotopic sources, magnetic elements or combined electrostatic and magnetic elements are also within the scope of the invention since in these cases, as mass-dispersive effects would not be a concern. Neutral particles entering the energy filter may be blocked either at element 304 or at the aperture assembly 310.

Figure 6:
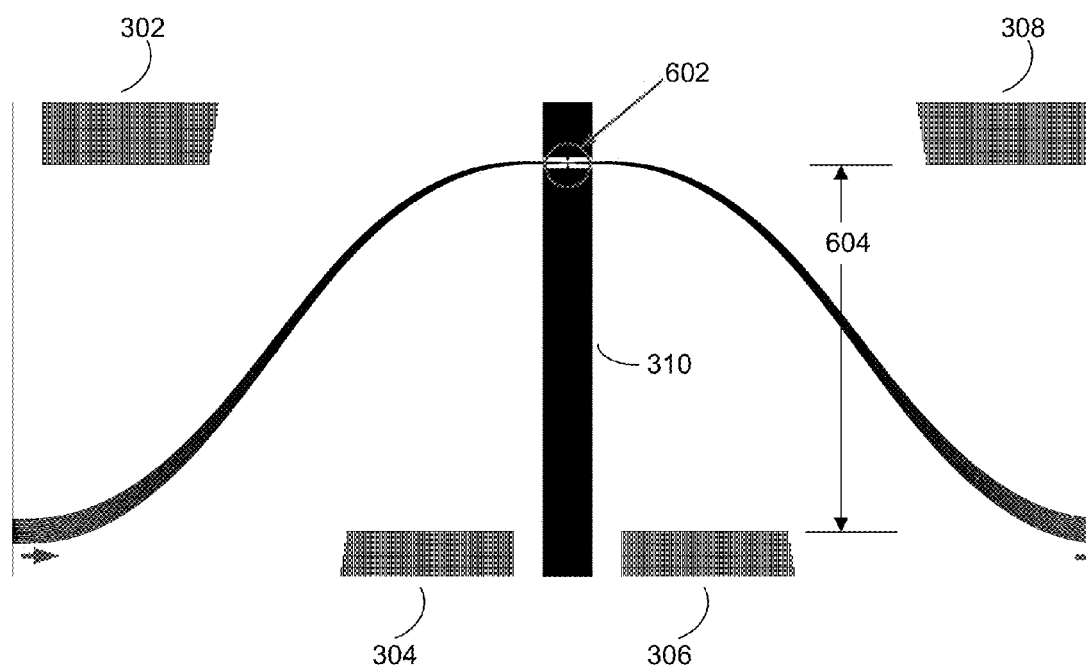
FIG. 6 is a side cross-sectional view of the aperture region of the energy filter of FIG. 5 with an expanded vertical axis.

FIG. 6 is a side cross-sectional view of the aperture region in FIG. 5 with a greatly expanded vertical axis to better illustrate the offset 604 of the beam. In preferred embodiments, typical beam offsets may be 2 to 4 mm. As an example, for an energy filter with a 3.0 mm beam offset and 176 mm long, the energy dispersion at the aperture is approximately 111 nm per eV of energy difference from the nominal energy of 30 keV. In preferred embodiments, aperture 602 within aperture assembly 310 can be either slit or knife-edge.

Figure 7A:
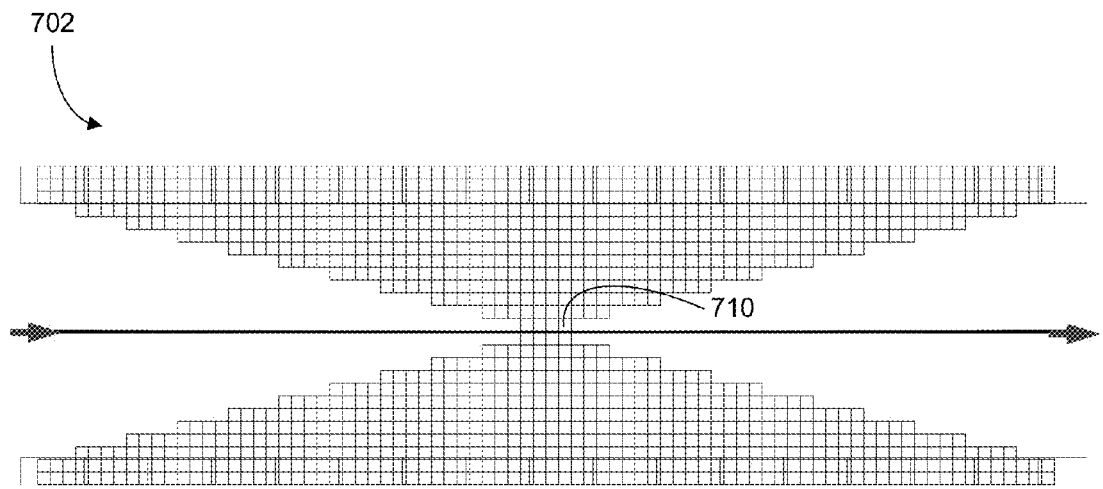
FIGS. 7A and 7B are close-up side cross-sectional views of the energy filter of FIG. 5 showing the aperture region of a bandpass filter and a high-pass filter.
Figure 7B:
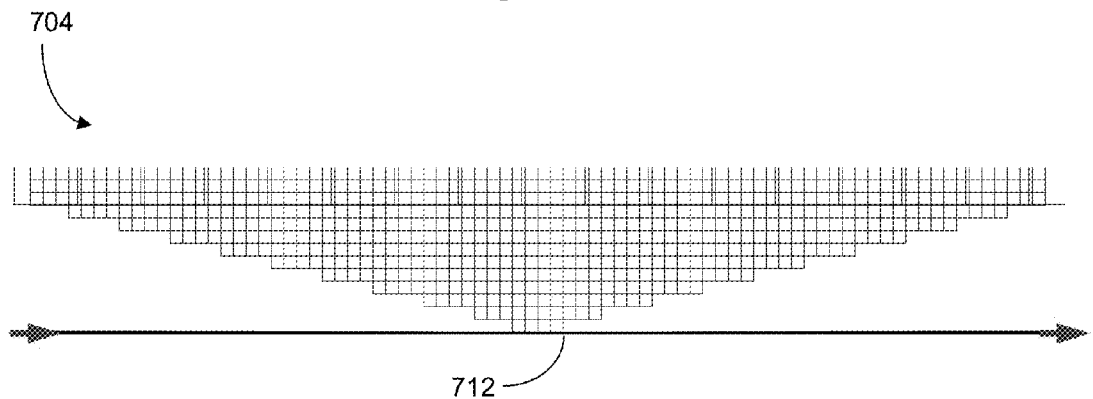

FIGS. 7A and 7B are close-up side cross-sectional views of FIG. 5 near the aperture region of a bandpass filter and a high-pass filter, respectively, taken from the SIMION ray-tracing program. FIG. 7A shows bandpass filter 702 with an aperture 710, the aperture having approximately a 600 nm gap for 3.4 eV FWHM transmission. FIG. 7B shows a high-pass filter 704 with a knife-edge aperture 712, where the fall off in transmission is 4.0 eV (100% to 0% transmission).

Figure 8:
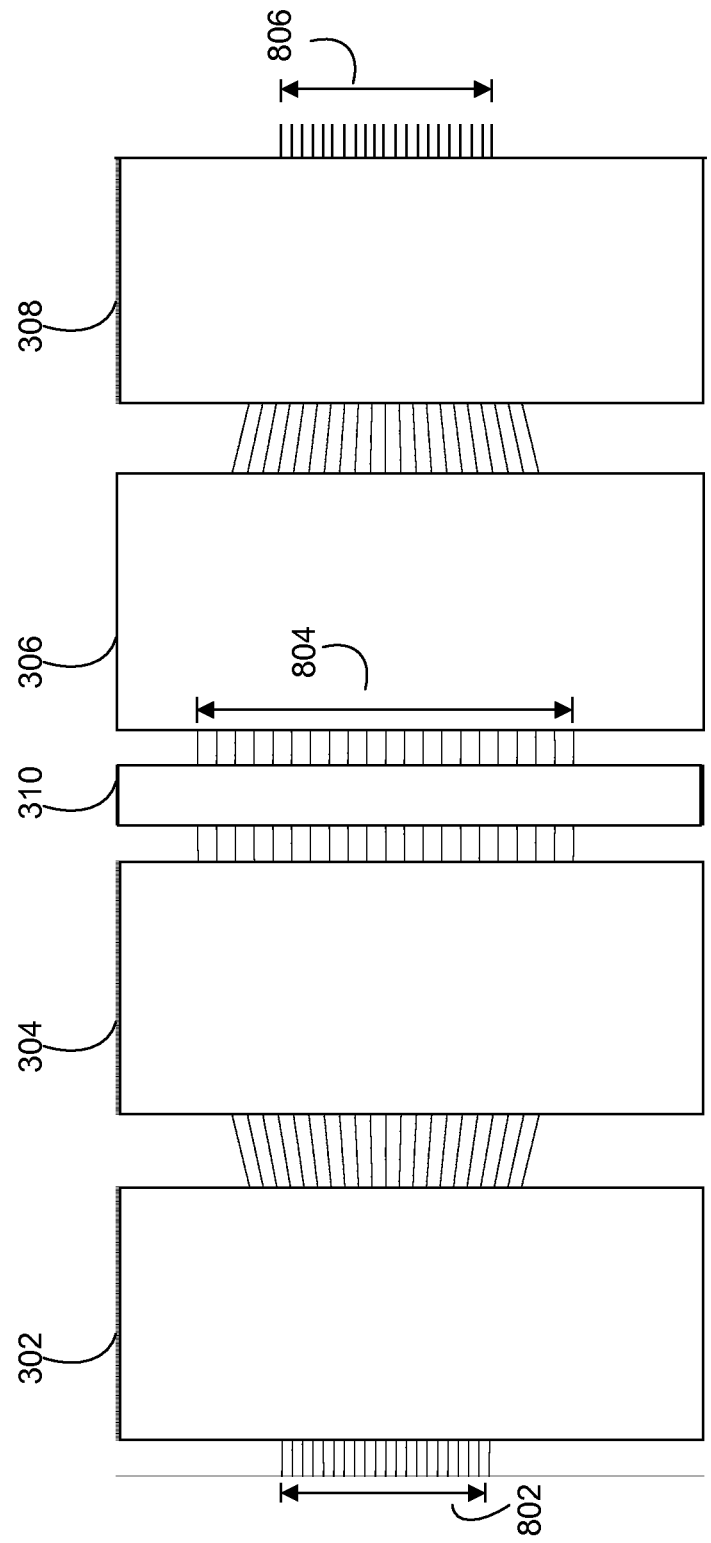
FIG. 8 illustrates a four-element chicane energy filter according to a preferred embodiment of the present invention, with combined dipole, quadrupole, and hexapole elements, as viewed parallel to the energy dispersion axis.

FIG. 8 illustrates a four-element chicane energy filter according to a preferred embodiment of the present invention, with combined dipole, quadrupole, and hexapole elements 302, 304, 306, and 308 as viewed parallel to the energy dispersion axis. The unfiltered beam has initial diameter 802, corresponding to a 200 µm diameter. The quadrupole excitation of 302 can be seen to function as a negative lens, broadening the beam as it passes between 302 and 304.

The opposite-polarity quadrupole excitation of 304 then brings the beam back to parallel, but now substantially wider. After passing 304, the beam diameter 804 is now approximately 360 µm wide. The quadrupole excitation of 306 then focuses the beam back towards the axis, followed by a defocusing action at 308 which makes the beam parallel again and the beam diameter 806 is returned to its initial diameter of 200 µm. This illustration corresponds to the case of a parallel beam in and a parallel beam out, however, the cases of diverging or converging beams entering and exiting the energy filter are also within the scope of the invention and have been evaluated using ray-tracing software.

Figure 9:
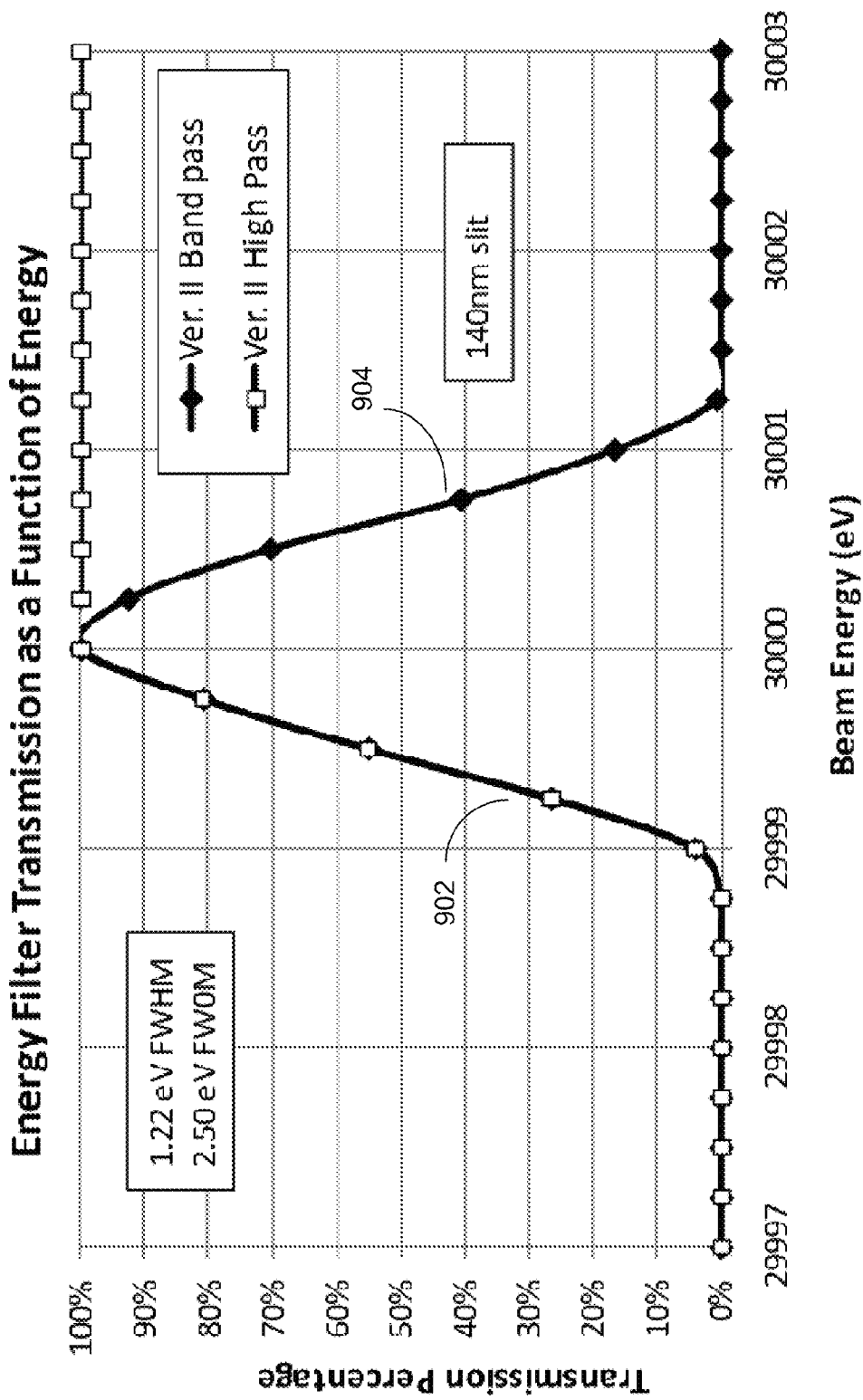
FIG. 9 is a graph of the calculated transmission of an exemplary energy filter according to a preferred embodiment of the present invention with a 140 nm slit width and a 3.0 mm beam offset at the aperture.

FIG. 9 is a graph of the calculated transmission of an exemplary energy filter according to a preferred embodiment of the present invention with a 140 nm-slit width and a 3.0 mm beam offset at the aperture. The full-with half-maximum (FWHM) transmission is 1.22 eV and the full-width zero-maximum (FW0M) is 2.50 eV. Thus, no charged particles with energies outside ~±1.25 eV will pass through the filter. The open squares line 902 corresponds to the case of a knife-edge aperture in a high-pass filtering mode, while the filled-in diamonds line 904 correspond to a 140 nm slit aperture in a bandpass mode. On the low-energy side (i.e., below 30000 eV), the two lines 902 and 904 coincide.

Figure 10:
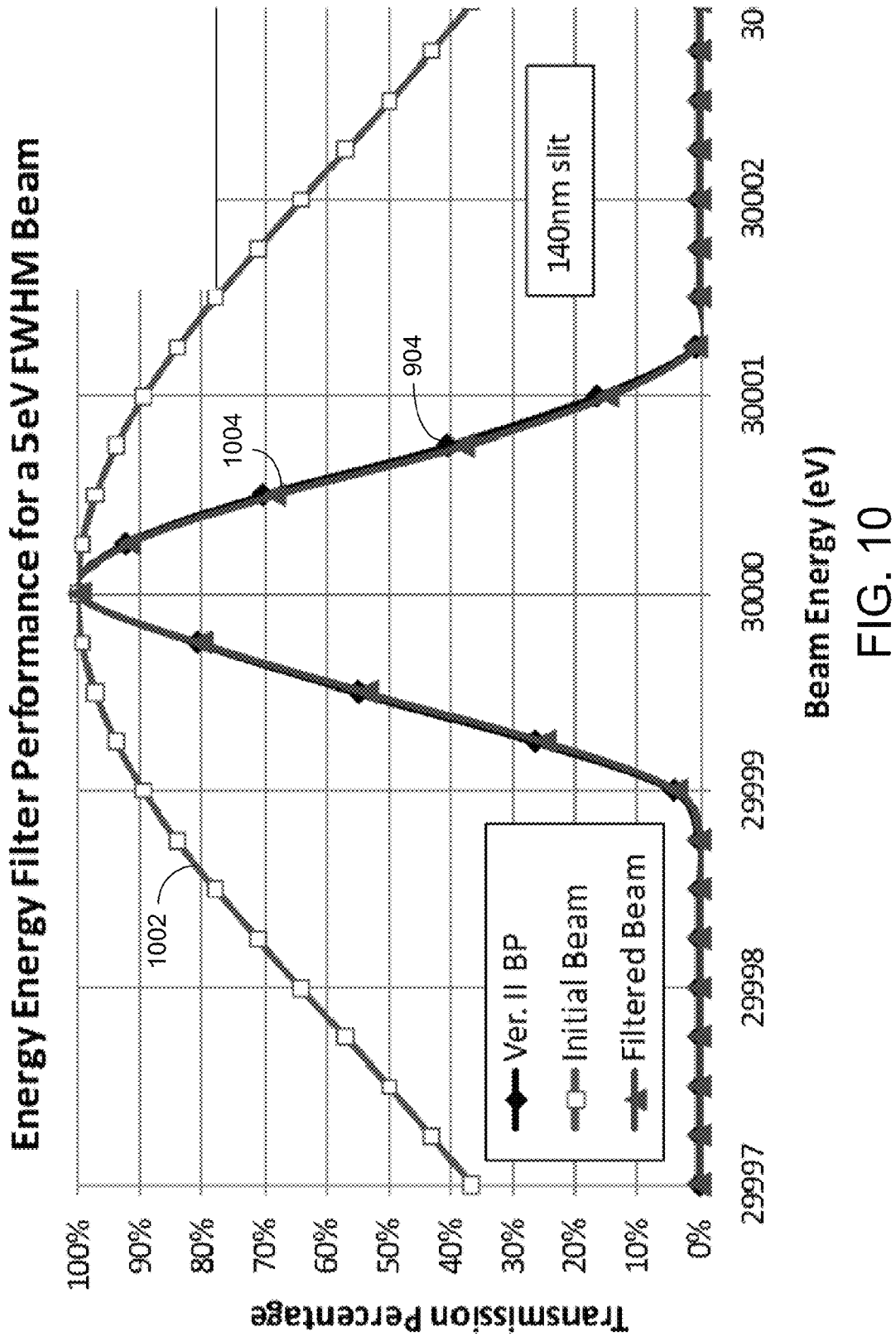
FIG. 10 is a graph of the 5.0 eV FWHM energy distribution for a typical Gallium liquid metal ion source.

FIG. 10 is a graph of the 5.0 eV FWHM energy distribution for a typical Gallium liquid metal ion source, plotted as open square line 1002. In the art, the FWHM energy distribution of LMIS sources may range from 5.0 to more than 6.0 eV. Also plotted is the transmitted energy distribution line 904 taken from FIG. 9, and the resultant energy distribution line 1004 (filled-in triangles) for the filtered Gallium beam exiting from the energy filter. After energy filtering, the beam energy spread has been reduced to approximately 1.2 eV FWHM and with zero transmission outside 2.5 eV FW0M. The total transmission is 22.4% of the initial bream current, thus the effective source brightness has been reduced by greater than four times. In this example, since the initial beam energy spread (~5.0 eV) is so much larger than the energy spread of the energy filter (~1.2 eV), the resultant beam energy spread 1004 is almost identical to that of the energy filter 904. In cases where the slit is wider, thereby giving a wider transmitted FWHM (see FIG. 11) the energy spread of the filtered beam will be smaller than that of the energy filter.

Figure 11:
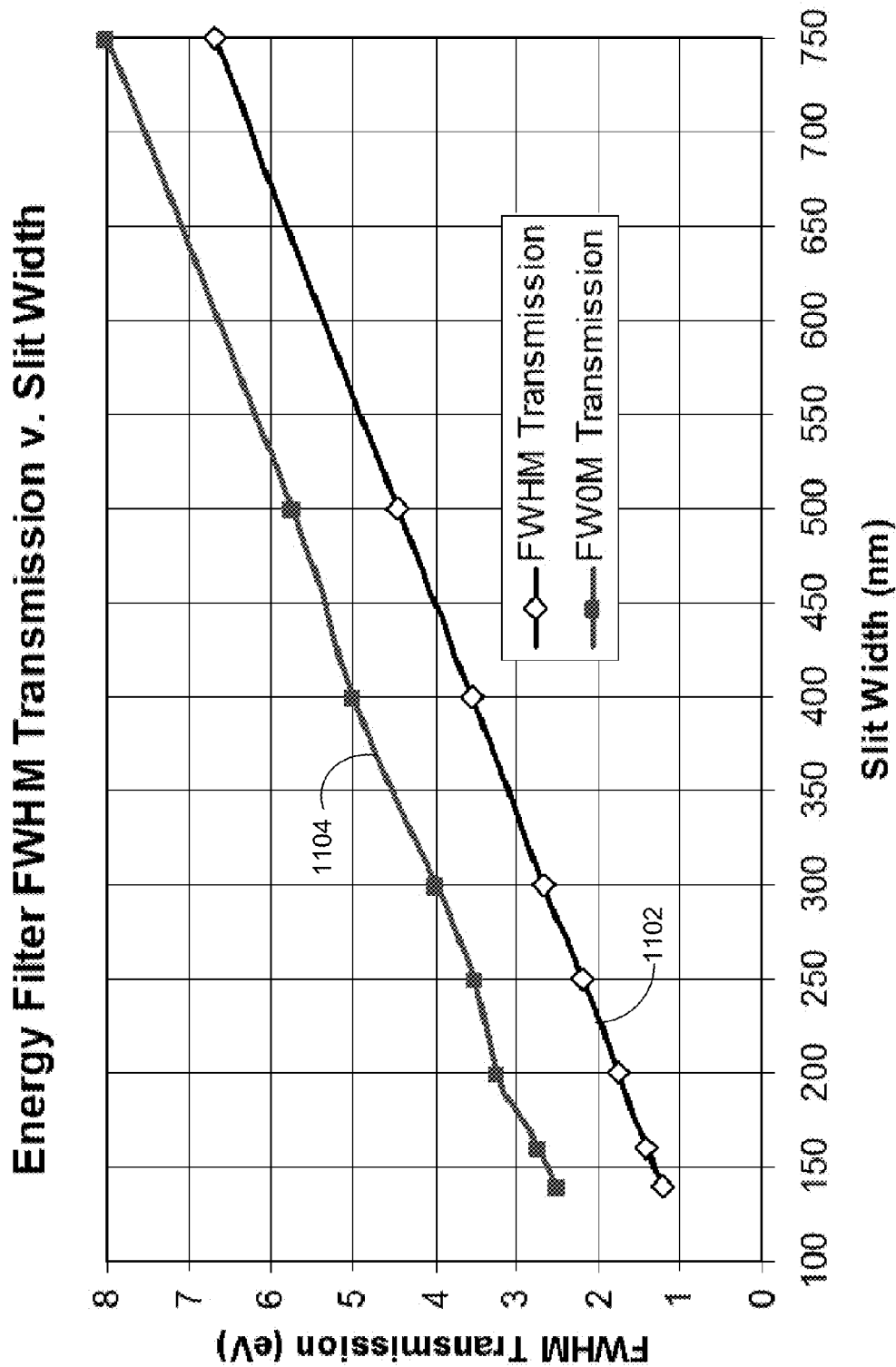
FIG. 11 is a graph of the FWHM transmission and the FWOM full energy range of an exemplary energy filter according to a preferred embodiment of the present invention as a function of the aperture slit width.

FIG. 11 is a graph of the FWHM transmission 1102 and the FW0M full energy range 1104 of an exemplary energy filter according to a preferred embodiment of the present invention as a function of the aperture slit width, ranging from a minimum of 140 nm up to 750 nm. The FWHM 1102 varies approximately linearly over this range from ~1.2 eV to ~6.7 eV, while the FW0M 1104 varies approximately linearly from ~2.5 eV up to ~8.0 eV. The FW0M corresponds to the energy spread outside of which no charged particles will be transmitted by the filter.

Figure 12:
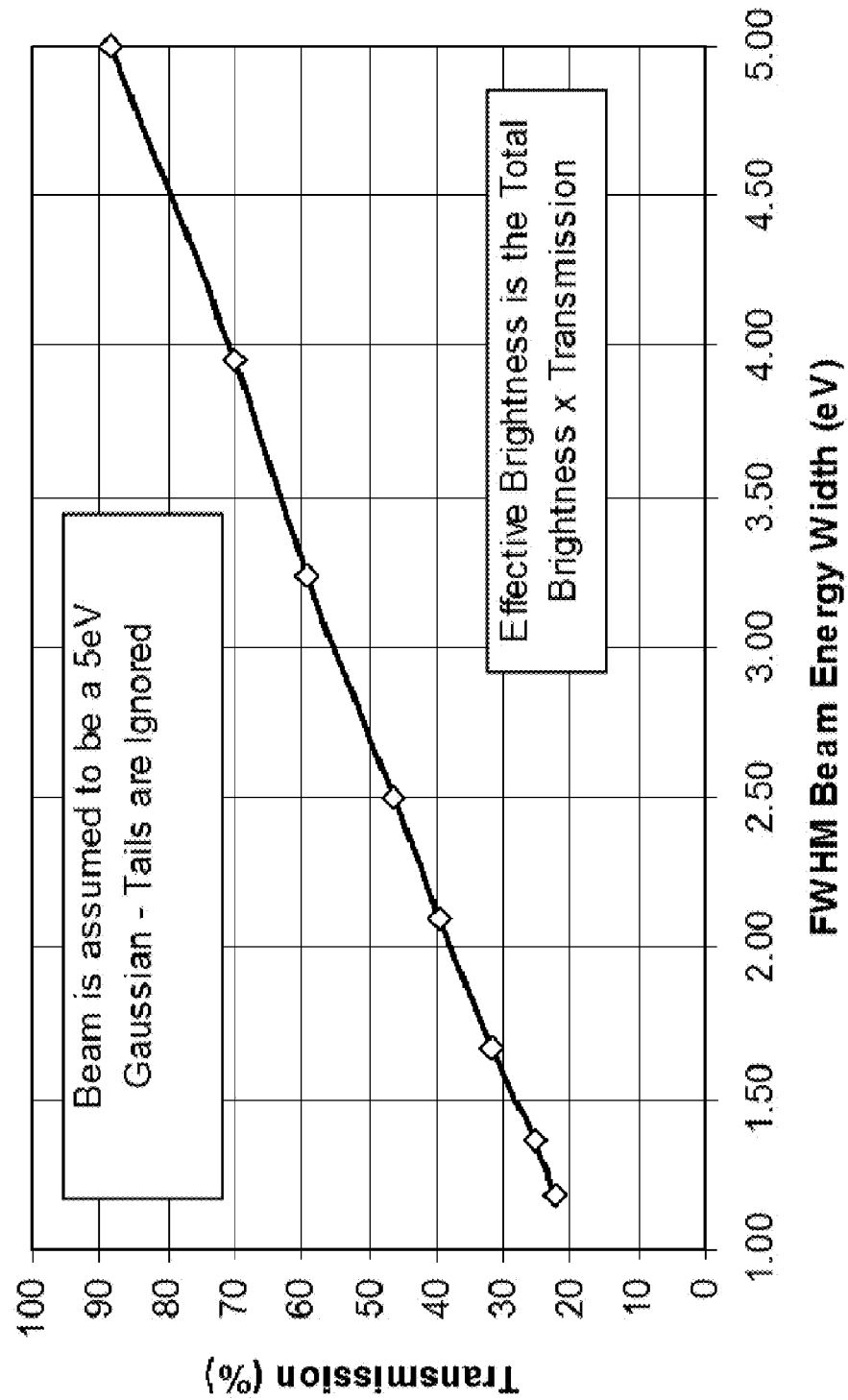
FIG. 12 is a graph of the energy filter transmission with a Gallium LMIS having an unfiltered FWHM energy spread of 5.0 eV.

FIG. 12 is a graph of the energy filter transmission with a Gallium LMIS having an initial (unfiltered) FWHM energy spread of 5.0 eV. As the aperture slit is narrowed (see FIG. 11), the transmitted FWHM energy drops from 5.0 eV at the right down to ~1.2 eV at the far left. Since the energy filter cannot change the ion energies, but merely blocks those charged particles having energies outside the desired bandpass range, the percent transmission drops from ~88% (5.0 eV FWHM) down to ~22.4% (~1.2 eV). This transmission decrease corresponds to a loss in the effective angular intensity and brightness. To preserve the beam current, it would typically be necessary to open up the beam-defining aperture to allow ions emitted by the source with larger initial angles relative to the optical axis to be transmitted to the target. However, this would then increase the chromatic and spherical aberrations, partially offsetting the beam size improvements resulting from energy filtering.

Figure 13:
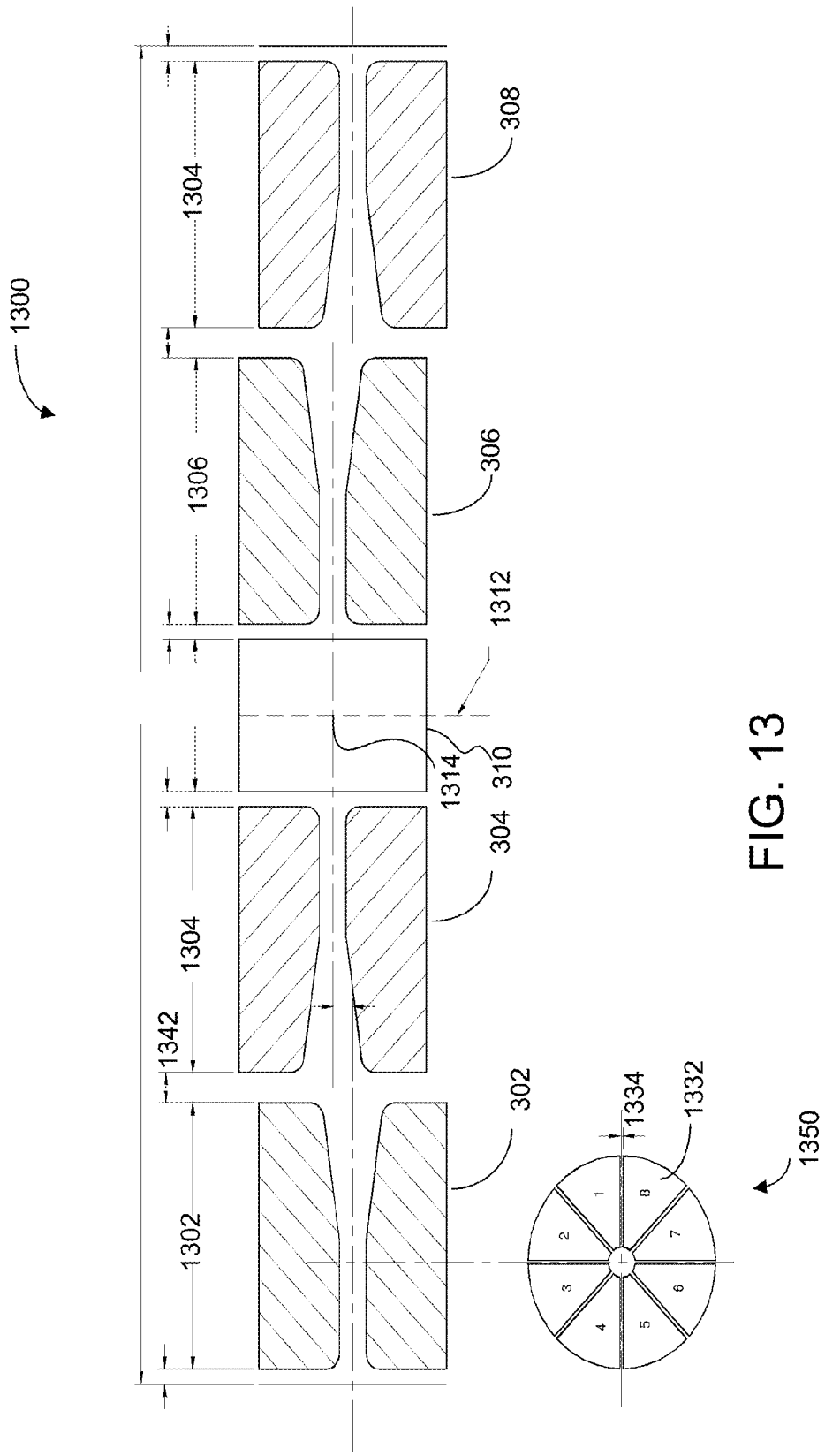
FIG. 13 is a cross-sectional diagram of a chicane energy filter according to a preferred embodiment of the present invention.

FIG. 13 is a cross-sectional diagram of a chicane energy filter 1300 according to a preferred embodiment of the present invention. In this example, element 304, the aperture assembly 310, and element 306 are offset from the axis of 302 and 308. In preferred embodiments, this offset is typically 2 to 3 mm. The azimuthal orientation of the electrodes 1332 in elements 302, 304, 306, and 308 is illustrated by octupole 1350. Gaps 1334 between the electrodes 1332 are preferably 0.5 mm-1.5 mm in width. In this embodiment, the lengths 1302, 1304, 1306, and 1308, respectively, are equal; however this is not required for proper operation of the energy filter. Cones are shown at the exits of 302 and 306 and at the entrances of 304 and 308 to allow the deflected beam to pass farther from any physical electrodes, thereby reducing aberrations. A movable slit aperture 1314 is located at the midplane 1312 of the energy filter as shown.

FIGS. 14A and 14B illustrate a chicane energy filter according to a preferred embodiment of the present invention operating as a conjugate beam blanker. In FIG. 14A, a beam 1402 is shown passing through slit aperture 1410. This is the normal energy filter-operating mode, where higher energy ions are blocked at the bottom of the slit, while lower energy ions are blocked at the top of the slit 1410 in this view. Ions with energies near the nominal transmission energy pass through the slit 1410, which is typically 0.5-3.0 μm in width. In FIG. 14B, the dipole excitations applied to 302, 304, 306, and 308 have been reduced by the same factor to maintain beam 1432 on the same exit axis (collinear to the entrance axis) as the beam is being blanked. Once the beam 1432 has moved down sufficiently at the slit aperture 1410 to block all ions over the full energy range of the beam including tails, the beam is blanked.

FIG. 15 illustrates a chicane energy filter according to a preferred embodiment of the present invention operating as part of a double-deflection beam scanning system. Element 308 of the filter works as an upper scanning deflector in conjunction with a lower scanning deflector 1502 and final lens 1504 to move beam 1510 across sample surface 1512. The beam 1510 is shown being deflected across the sample surface 1512 by the double-deflection scanning system which steers the beam 1510 through lens 1504 for optimal scanning. For telecentric beam scanning (where the beam is always perpendicular to the sample surface), the beam pivot point would be the back focal plane of the lens.

FIG. 16 illustrates a chicane energy filter according to a preferred embodiment of the present invention operating as a double-deflection aligner to steer beam 1610 into the center of lens 1604 and parallel to the optical axis of lens 1604. In this case, elements 306 and 308 operate as double-deflection aligners. This alignment capability minimizes the optical aberrations of the beam which is focused onto the sample. The dipole excitations applied to elements 306 and 308 are dynamic during the alignment process and are then static after alignment is completed.

FIG. 17 is a chicane energy filter according to a preferred embodiment of the present invention operating to measure the beam current prior to energy filtering. Elements 302 and 304 (either individually or in combination) act to deflect beam 1702 towards faraday cup 1710, which is located before the slit aperture 1712. Beam 1702 passes inside the bore of element 302 and between electrodes 6 and 7 of element 304 (as seen in FIG. 13). The current detected by faraday cup 1710 represents the beam current prior to energy filtering. This operation would typically be performed after the beam blanking operation illustrated in FIG. 14.

FIG. 18 is a chicane Energy Filter according to a preferred embodiment of the present invention operating to measure the beam current after energy filtering. Elements 302 and 304 (either individually or in combination) act to deflect beam 1802 through slit aperture 1812. Elements 306 and 308 (either individually or in combination) act to deflect the beam towards faraday cup 1804, which is located near element 308 as shown. The current detected by faraday cup 1804 represents the beam current after energy filtering. Beam 1802 passes inside the bores of elements 302, 304, and 306 and between the second and third electrodes of element 308. The ratio of the current collected by faraday cup 1804 to the current collected by faraday cup 1710 in FIG. 17 represents the fraction of the initial beam current which is transmitted by the energy filter. This operation would typically be performed after the beam blanking operation illustrated in FIG. 14.

Figure 19:
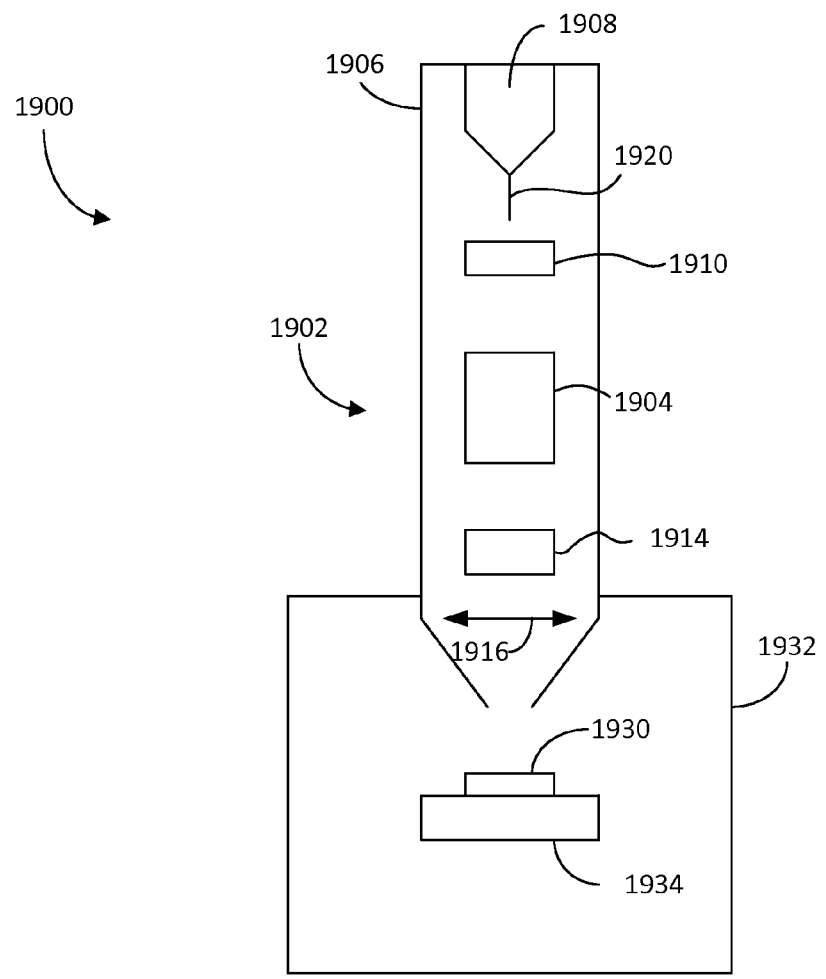
FIG. 19 shows a charged particle beam system with an energy filter according to the present invention.

FIG. 19 shows a charged particle beam system 1900 with an ion beam column 1902 and energy filter 1904 according to preferred embodiments of the present invention. Energy filters according to the present invention such as the ones described above can be used to significantly improve beam quality. Ion beam column 1902 includes an evacuated envelope 1906 within which are located an ion source 1908, extractor optics 1910, energy filter 1904, beam deflectors 1914, and a final lens 1916. Typically, ion source 1908 is a liquid metal ion source that provides a beam of gallium ions, although other ions, such as multicusp or other plasma ion sources can be used. Ions from source 1908 are extracted and formed into a beam 1920 by extractor optics 1910, and beam 1920 then passes through energy filter 1904. Energy filter 1904 decreases space charge effects and aperture damage and can also function as a conjugate blanker in certain embodiments. Beam deflectors 1914 scan the beam, which is then focused by a final lens 1916 onto a sample 1930 on a sample stage 1934 within a vacuum chamber 1932. Beam 1920 can thus modify the sample by, for example, milling, chemically enhanced etching, material deposition, or imaging according to known methods.

FIG. 20 is a side cross-sectional view 2000 of an embodiment of the invention comprising five octupoles. Octupoles 2002, 2010, 2016, 2024, and 2030 preferably do not have conical ends as in the first embodiment illustrated in FIG. 4. The ion beam enters octupole 2002 along column axis 2040, and is then bent towards the right so that the beam passes through the central hole in termination plate 2004 slightly off-axis to the right. Octupole 2002 also starts the line-focusing process which is continued by octupole 2010 to form a line focus within the slit aperture region 2044. The beam passes through the central hole in termination plate 2008 slightly off-axis to the left, and then into octupole 2010 which deflects the beam to be parallel to the column axis 2040, but offset by roughly 4 mm onto an axis 2042. The beam then passes through the central hole in termination plate 2012 to enter the slit aperture region 2044. The slit aperture region 2044 is bounded by termination plates 2012 and 2014 and contains the slit aperture (not shown). A portion of the ion beam passes through the slit aperture, according to the amount of narrowing of the beam energy distribution which is desired. Typically, a 500 nm wide slit will pass about a 3.5 eV energy width out of a typical 5 to 6 eV FWHM energy spread from a liquid metal ion source.

That portion of the beam which passes through the slit aperture then passes through the central hole in termination plate 2014 and enters octupole 2016 which deflects the beam to the left to pass through the central hole in termination plate 2018 slightly off-axis to the left, and also focuses the beam into a line-focus at the center of octupole 2024. The line focus at octupole 2024 is perpendicular to both the optical axis 2040 and to the line focus within the slit aperture region 2044. Before entering octupole 2024, the beam passes through the central hole in termination plate 2022 slightly off-axis to the right. Octupole 2024 deflects and focuses the ion beams passing through into a circular beam profile at octupole 2030. Octupole 2030 then focuses the ions into a diverging conical round beam which passes into the final lens of the column, such as lens 516 in FIG. 19.

An alternative operating mode allows the beam current passing through the slit aperture to be measured, as in FIG. 18 for the previous embodiment. In this alternative mode, the deflections and line focusing performed by octupoles 2002 and 2010 are unchanged, but octupole 2016 functions only as a weak deflector to steer the beam along axis 2042 into a lower Faraday cup 2028 located between octupoles 2024 and 2030 in block 2046. The entrance to Faraday cup 2028 is formed by a hole in termination plate 2026, as shown. The lower end of block 2046 also serves as a termination plate for octupole 2030. Termination plates 2004, 2008, 2012, 2014, 2018, 2022, 2026, and block 2046, all serve to terminate the electric fields generated by octupoles 2002, 2010, 2016, 2024, and 2030 to reduce optical aberrations which may be induced by extended electric fields at the entrances and exits of octupoles with dipole, quadrupole, hexapole, and octupole excitations. Break 2006 between termination plates 2004 and 2008 indicates that the distance between octupoles 2002 and 2010 may be adjusted to optimize the integration of the energy filter with the overall design of a FIB column as well as to optimize the performance of the energy filter. Break 2020 between termination plates 2018 and 2022 serves a similar function.

Figure 21:
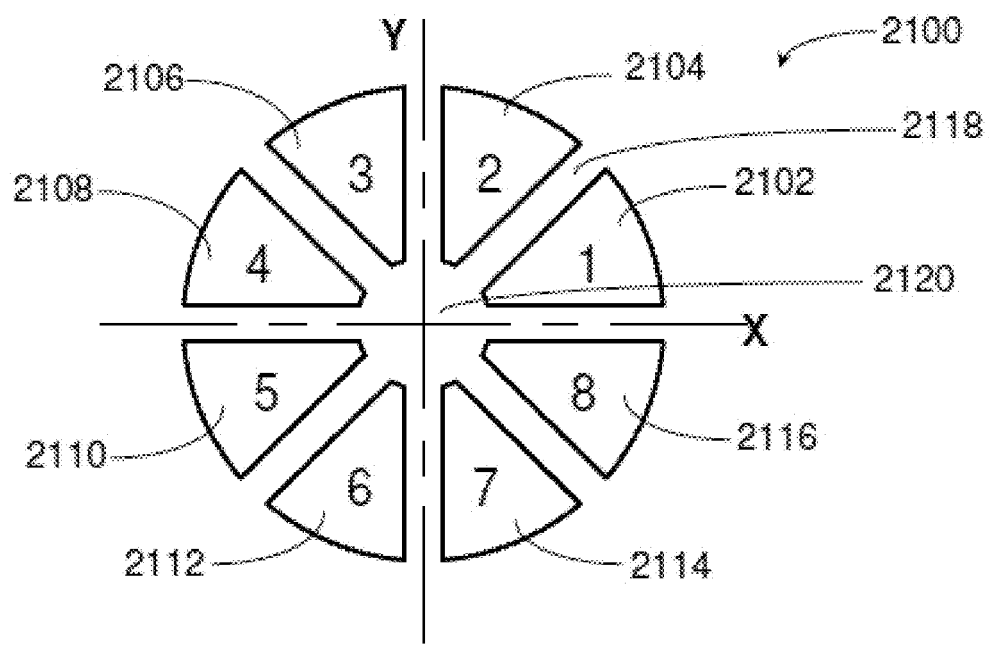
FIG. 21 shows cross-section A-A from FIG. 20.

FIG. 21 illustrates cross-section A-A 2100 in FIG. 20, showing the eight electrodes of octupole 2002. Octupole elements 2102, 2104, 2106, 2108, 2110, 2112, 2114, and 2116 are each connected to separate variable high voltage power supplies to enable the generation of dipole, quadrupole and hexapole electric fields to effect the optical functions described in FIG. 20, above. Eight gaps 2118 between the electrodes enable high voltage isolation between electrodes, each of which may be at a different high voltage, typically over a range from −700 V to +700 V. A central bore 2120 allows passage of the ion beam through the octupole, and may typically have a diameter ranging from 3 to 6 mm. Although cross-section A-A is shown for octupole 2002, the other four octupoles 2010, 2016, 2024, and 2030 may have similar or identical electrode configurations.

Figure 22:
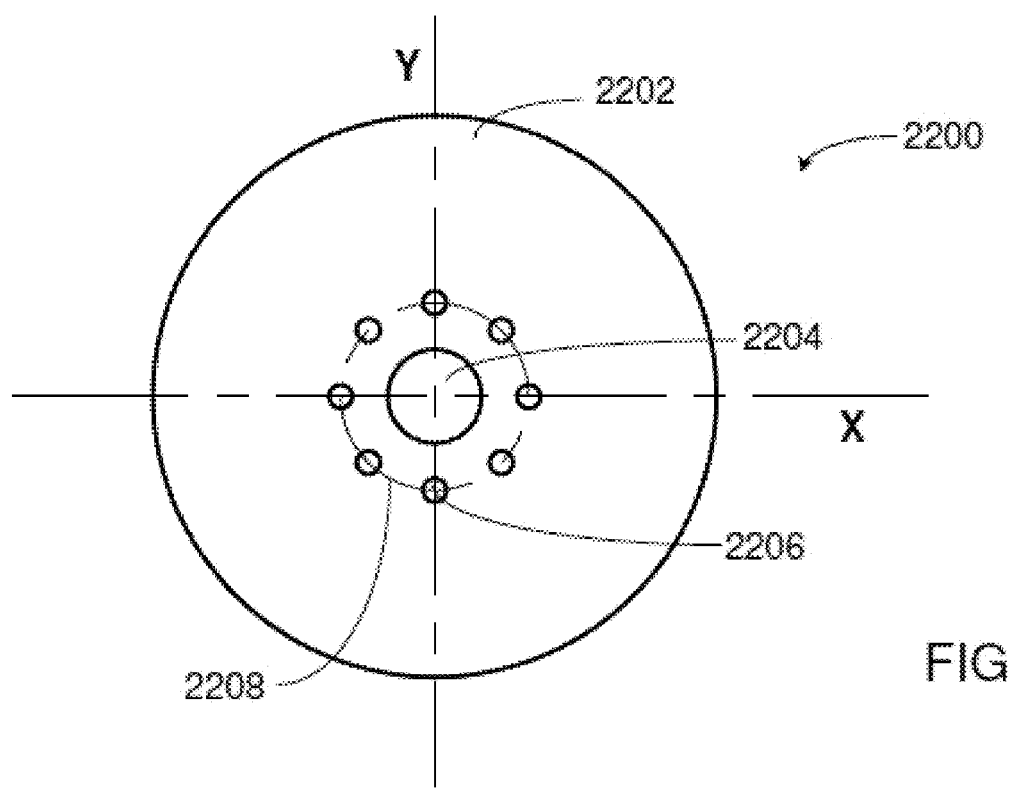
FIG. 22 shows cross-section B-B from FIG. 20.

FIG. 22 illustrates cross-section B-B 2200 in FIG. 20, showing termination plate 2008. The central hole 2204 allows passage of the beam at the entrance of octupole 2010. When the energy filter is off and the beam remains on axis 2040, the beam passes through hole 2206, instead of hole 2204. The radius of circle 2208 corresponds to the distance between axes 2040 and 2042 in FIG. 20. The additional seven holes in plate 2202 make the electric field more symmetrical, which would not be the case with a single hole 2206.

An additional operating mode for the energy filter is when all electrode voltages in the five octupoles are set to 0 V. This mode allows the ion beam to pass undeflected through the filter and on down the column to the final lens, such as lens 516 in FIG. 19. A benefit of this mode is the ability to operate with higher beam currents where the dominant aberration is spherical, not chromatic, and thus the energy filter would have limited benefits for reducing the beam diameter or increasing the beam current density at the target.

Skilled persons will recognize that there are many possible configurations for a focused ion beam system, and the invention is not limited to any particular focused ion beam system. For example, deflectors 1914 may be positioned below final lens 1916 or an initial focusing lens can be positioned before the energy filter 510. Even though an ion beam is described in detail, embodiments of the present invention can also allow the use of other charged particle beams, such as electron beams or laser beams.

Figure 23:
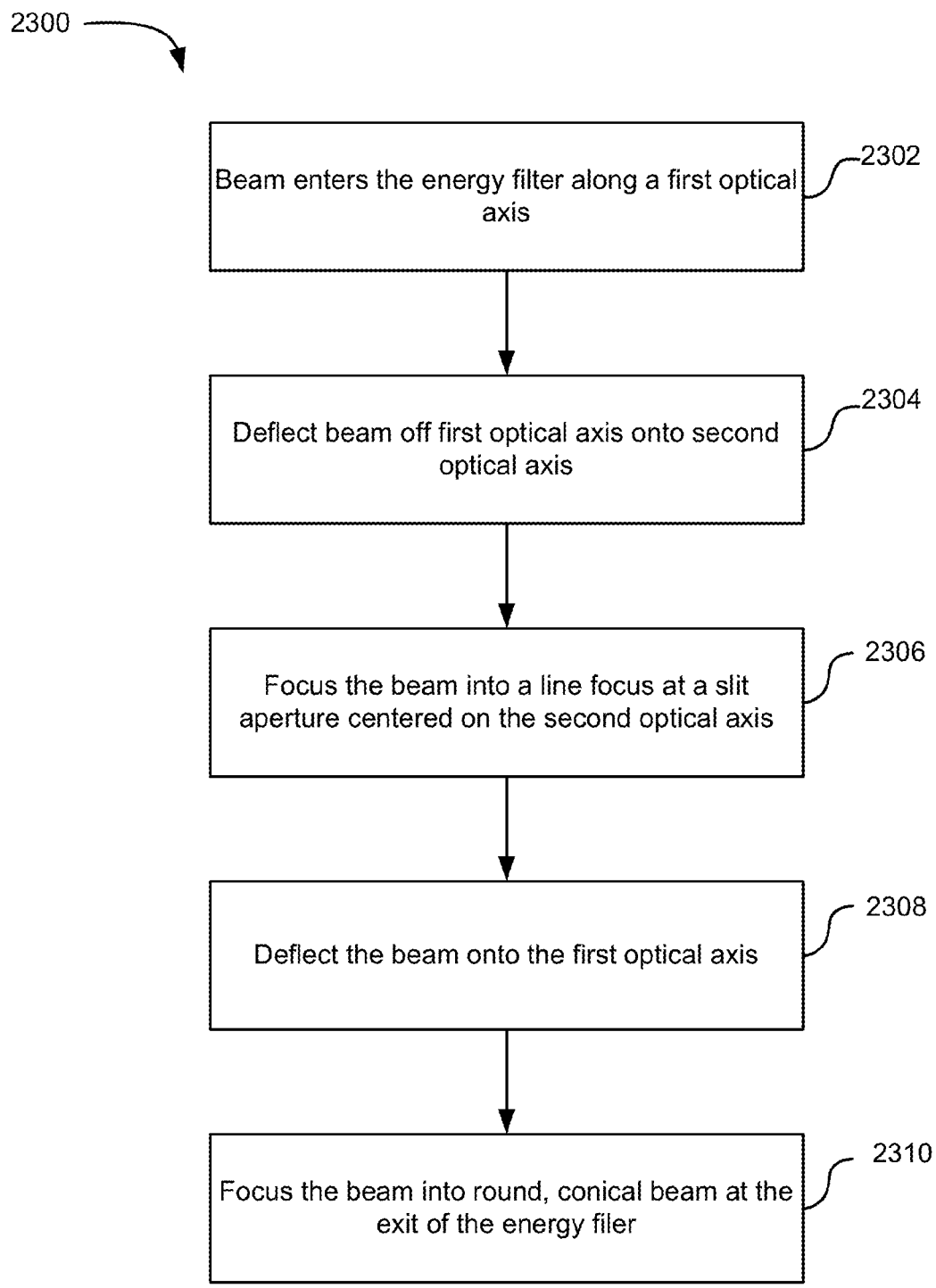
FIG. 23 is a flow chart showing a preferred method of the present invention.

FIG. 23 is a flow chart 2300 showing a method that embodies the present invention. In step 2302, a beam enters an energy filter along a first optical axis. In step 2304, the beam is deflected from the first optical axis onto a second optical axis. The second axis in some embodiments is approximately parallel to the first optical axis. The spacing between the optical axes is preferably between 2 mm and 4 mm. Deflecting the beam off the first optical axis can be preformed, for example, using multiple dipole electrostatic deflectors. In step 2306, the beam is focused into a line focus at a slit aperture centered on the second axis. In some embodiments, focusing the beam into a line focus is performed using multiple quadrupole lenses. In step 2308, the beam is deflected back on to the first optical axis. Deflecting the beam off the second optical axis can be preformed, for example, using multiple dipole electrostatic deflectors. In step 2310, the beam is focused into a round, conical beam at the exit of the energy filter. The beam may be focused into the round beam using multiple quadrupole lenses. In some embodiments, deflecting the beam off the first optical axis and the focusing the beam into a line focus at a slit aperture are effected by common optical elements comprising both deflectors and quadrupole lenses. In some embodiments, deflecting the beam off the second optical axis and the focusing the beam into a round, conical beam are effected by common optical elements comprising both deflectors and quadrupole lenses.

Although the description of the present invention above is mainly directed at an apparatus, it should be recognized that a method of using the claimed apparatus would further be within the scope of the present invention. Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for use with an apparatus according to the present invention are commercially available, for example, from FEI Company, the assignee of the present application.

In the following discussion and in the claims, the terms "including" and "comprising" are used in an open-ended fashion, and thus should be interpreted to mean "including, but not limited to . . . " The term "FIB" or "focused ion beam" is used herein to refer to any collimated ion beam, including a beam focused by ion optics and shaped ion beams. To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A computer-readable storage medium comprising executable instruction that, when executed, cause a computer to direct an operation of an energy filter of a charged particle beam system,
   wherein the energy filter comprises:
      an entrance and an exit for passing a charged particle beam passing through the energy filter, said charged particle beam being directed on an axis;
      at least four deflectors arranged in series configuration between the entrance and the exit for focusing and deflecting the charged particle beam passing through the energy filter; and
      an aperture positioned between two of the deflectors of the at least four deflectors,
   wherein the operation of the energy filter comprises:
      deflecting a charged particle beam off of the axis and then back on the axis by applying dipole excitation to the at least four deflectors; and
      widening a width of the charged particle beam and forming the charged particle beam into a line focus at the aperture by applying the quadrupole excitations to the at least four deflectors.

2. The computer-readable storage medium of claim 1 in which the aperture is either a knife-edge aperture or a slit aperture.

3. The computer-readable storage medium of claim 2 in which the aperture is a slit aperture measuring 1-3 µm across.

4. The computer-readable storage medium of claim 2 in which the aperture is a slit aperture measuring 500 nm or less across the slit.

5. The computer-readable storage medium of claim 1 in which the line focus is at least twice as long as the diameters of the incoming and outgoing beams at the entrance and exit, respectively, to the energy filter.

6. The computer-readable storage medium of claim 1 in which the aperture is positioned between a second and third deflectors of the at least four deflectors.

7. The computer-readable storage medium of claim 1 in which the at least four deflectors comprise at least four octupoles, each of the at least four octupoles having eight separately excited electrodes.

8. The computer-readable storage medium of claim 7 in which each of the at least four octupoles is electrostatic.

9. The computer-readable storage medium of claim 1 in which there is effectively no crossover from perspective of the column first-order optics and with respect to space-charge beam broadening.

10. The computer-readable storage medium of claim 1 in which the entrance axis of the energy filter is coaxial with the exit axis of the energy filter.

11. The computer-readable storage medium of claim 1 further comprising the capability for conjugate blanking of the beam.

12. The computer-readable storage medium of any of claim 1 in which the final deflector of the energy filter may double as the upper deflector for beam scanning 13. The computer-readable storage medium of claim 1 in which neutral particles are removed from the charged particle beam by blocking the neutral particles at an aperture mounting assembly within the energy filter.

14. The computer-readable storage medium of claim 1 in which pre-focusing of the beam into the plane of the aperture is not required.

15. A charged particle system comprising:
a source of charged particles;
a charged particle beam lens; and
a computer-readable storage medium, a computer, and an energy filter in accordance with claim 1.

16. A method of processing a sample using a computer-readable storage medium, a computer, and an energy filter according to claim 1 in which processing unintended areas prevented by using four of the at least four deflectors of the energy filter as an "extended" beam blanker with appropriate time delays between the at least four deflectors to account for the time-of-flight through the energy filter.

17. The method of claim 16 in which the beam blanking is implemented using multiplying digital-to-analog convertors to drive the electrode voltages and then modulating the reference voltage to change the deflection strengths of all of the at least four deflectors with inter-element time delays.

18. A computer-readable storage medium, comprising executable instructions that, when executed, cause a computer to direct an operation of a chicane-type energy filter for a charged particle beam system,
wherein the chicane-type energy filter has at least four deflectors arranged in a series for double deflection of a charged particle beam, and
wherein the operation of the chicane-type energy filter comprises:
deflecting the charged particle beam from a first axis onto a second axis;
applying dipole, quadrupole, and hexapole execitation to the at least four deflectors, wherein applying the quadrupole excitations widens a width of the charged particle beam and focuses the charged particle beam into a line focus at an energy-filtering aperture;
passing the charged particle beam through the energy-filtering aperture; and then
deflecting the charged particle beam from the second axis back to the first axis.

19. A method for filtering an energy distribution of an ion beam using an energy filter within a focused ion beam system, comprising the steps of:
directing an ion beam generated by the focused ion beam system to enter the energy filter along a first optical axis;
deflecting the ion beam off the first optical axis onto a second optical axis;
widening a width of the ion beam and focusing the ion beam into a line focus at a slit aperture centered on the second optical axis;
deflecting the ion beam from the second optical axis onto a third optical axis; and
focusing the ion beam into a round, conical beam at the exit of the energy filter.

20. The method of claim 19 wherein the third optical axis is coincident with the first optical axis and deflecting the ion beam from the second optical axis onto a third optical axis comprises directing the ion beam back onto the first optical axis.

21. The method of claim 19 wherein the second optical axis is approximately parallel to the first optical axis.

22. The method of claim 19 wherein the deflecting the ion beam off the first optical axis is effected by a multiplicity of dipole electrostatic deflectors.

23. The method of claim 19 wherein the deflecting the ion beam from the second optical axis is effected by a multiplicity of dipole electrostatic deflectors.

24. The method of claim 19 wherein widening a width of the ion beam and focusing the ion beam into a line focus at a slit aperture is effected by a multiplicity of quadrupole lenses.

25. The method of claim 19 wherein the focusing the ion beam into a round, conical beam is effected by multiple quadrupole lenses.

26. The method of claim 19 wherein the deflecting the ion beam off the first optical axis and the focusing the ion beam into the line focus at a slit aperture are effected by common optical elements comprising both deflectors and quadrupole lenses.

27. The method of claim 19 wherein the deflecting the ion beam off the second optical axis and the focusing the ion beam into a round, conical beam are effected by common optical elements comprising both deflectors and quadrupole lenses.

28. The method of claim 19, wherein a spacing between the first and second optical axes is between 2 and 4 mm.

* * * * *